(12) United States Patent
Hinode et al.

(10) Patent No.: US 10,553,459 B2
(45) Date of Patent: Feb. 4, 2020

(54) SUBSTRATE PROCESSING METHOD

(71) Applicant: SCREEN Holdings Co., Ltd., Kyoto (JP)

(72) Inventors: Taiki Hinode, Kyoto (JP); Sadamu Fujii, Kyoto (JP); Rei Takeaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 201 days.

(21) Appl. No.: 15/671,394

(22) Filed: Aug. 8, 2017

(65) Prior Publication Data
US 2018/0061677 A1 Mar. 1, 2018

(30) Foreign Application Priority Data

Aug. 30, 2016 (JP) ................................. 2016-168283

(51) Int. Cl.
H01L 21/67 (2006.01)
H01L 21/02 (2006.01)

(52) U.S. Cl.
CPC .. H01L 21/67034 (2013.01); H01L 21/02041 (2013.01); H01L 21/67051 (2013.01)

(58) Field of Classification Search
None
See application file for complete search history.

(56) References Cited

U.S. PATENT DOCUMENTS

| 2013/0174873 A1 | 7/2013 | Yoshihara et al. ............... 134/19 |
| 2014/0174483 A1 | 6/2014 | Miya et al. ....................... 134/30 |
| 2015/0243542 A1 | 8/2015 | Yoshihara et al. ........ 156/345.15 |

FOREIGN PATENT DOCUMENTS

| JP | 2009-212301 A | 9/2009 |
| JP | 2010-177371 A1 | 8/2010 |
| JP | 2013-140881 A | 7/2013 |
| JP | 2015-115584 A | 6/2015 |
| KR | 10-2015-0101951 A | 9/2015 |
| TW | 200818283 A | 4/2008 |

*Primary Examiner* — Eric W Golightly
(74) *Attorney, Agent, or Firm* — Ostrolenk Faber LLP

(57) ABSTRACT

A substrate processing method includes a liquid film forming step of supplying a low surface tension liquid onto the upper surface of the substrate while rotating the substrate at a first rotational speed, in order to form a liquid film of the low surface tension liquid on the upper surface of the substrate, a rotation decelerating step of decelerating rotation of the substrate to a second rotational speed while continuing the liquid film forming step, after a processing liquid on the substrate has been replaced with the low surface tension liquid, an opening forming step of forming an opening in the center region of the liquid film on the substrate that rotates at the second rotational speed after completion of the liquid film forming step, and a liquid film removing step of removing the liquid film from the upper surface of the substrate by widening the opening.

10 Claims, 11 Drawing Sheets

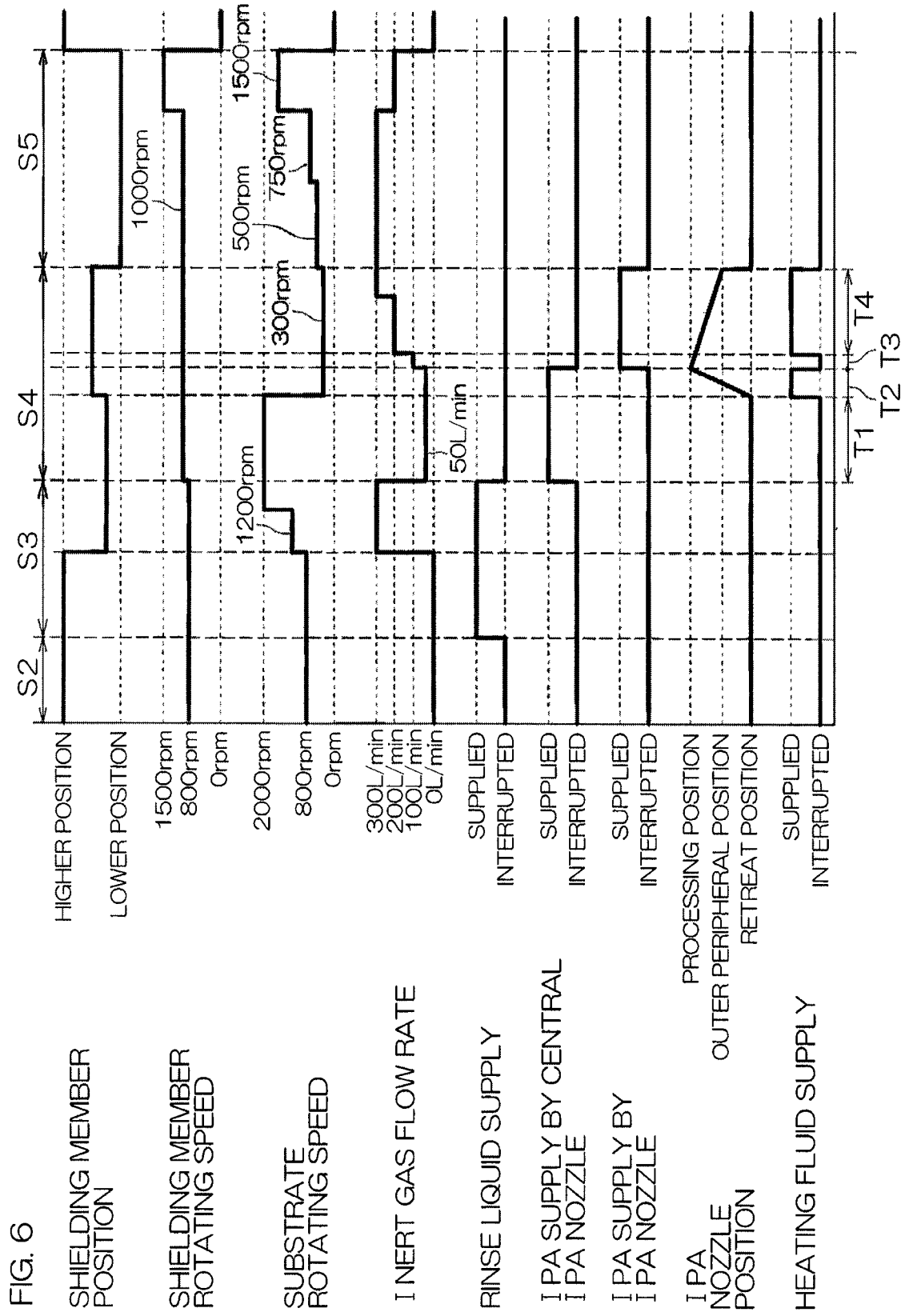

SUBSTRATE PROCESSING METHOD

BACKGROUND OF THE INVENTION

1. Field of the Invention

The present invention relates to a substrate processing method by which a substrate is processed. Examples of substrates to be processed include substrates such as semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of the Related Art

In substrate processing with a single substrate processing type substrate processing apparatus that processes substrates one by one, a chemical liquid is supplied to a substantially horizontally held substrate by a spin chuck, for example. A rinse liquid is then supplied to the substrate. Thereby, the chemical liquid on the substrate is replaced with the rinse liquid. A spin drying step is then carried out to remove the rinse liquid on the substrate.

As shown in FIG. 10, in a case where a fine pattern is formed on the front surface of the substrate, the rinse liquid that has entered the interior of the pattern cannot be removed in the spin drying step. Thus, drying defects may be caused. A liquid surface of the rinse liquid that has entered the interior of the pattern (an interface between the air and the liquid) is formed in the interior of the pattern. Therefore, surface tension acts on the liquid at a position where the liquid surface and the pattern are in contact. In a case where the surface tension is high, the pattern is more likely to collapse. Water, a typical rinse liquid, has high surface tension. Therefore, collapse of the pattern in the spin drying step cannot be ignored.

Thus, in order to dry the upper surface of the substrate, it can be considered that isopropyl alcohol (IPA), which is a low surface tension liquid having lower surface tension than water, is supplied to replace the water which has entered the interior of the pattern with the IPA, and thereafter the IPA is removed.

In the substrate processing described in Japanese Patent Application Publication No. 2010-177371, after a liquid film of water has been formed on the substrate, the liquid film of water is replaced by IPA. The liquid film is then formed in an annular shape by forming a hole at the center section of the IPA liquid film by blowing nitrogen gas. Furthermore, by increasing the inner diameter of the annular liquid film by applying centrifugal force to the IPA on the substrate by rotation of the substrate, the IPA liquid film is pushed to the outside of the substrate. The IPA is thus removed from the top of the substrate.

During the substrate processing, when the liquid film of water is to be replaced by IPA, rotation of the substrate is accelerated in a stepwise manner in the order of 10 rpm, 50 rpm, 75 rpm, 100 rpm, and 500 rpm, after which the rotational speed of the substrate is kept at 500 rpm. In addition, when the IPA liquid film is shaped to an annular form and the inner diameter of the liquid film is increased, the rotational speed of the substrate is changed to 700 rpm.

SUMMARY OF THE INVENTION

In the substrate processing described in Japanese Patent Application Publication No. 2010-177371, rotation of the substrate is accelerated in a stepwise manner when the liquid film of water is replaced by IPA. Consequently, along time is required for replacement of the liquid film of water by IPA, and productivity may potentially be reduced. Rotation of the substrate is also further accelerated when the IPA liquid film is extruded from above the substrate. Consequently, the action of increased centrifugal force may result in disruption of the IPA liquid film on the upper surface of the substrate and partial residue of IPA droplets on the upper surface of the substrate. Until the droplets finally evaporate, the liquid surface of the IPA (which may include trace amounts of moisture dissolved in the IPA) continues to exert surface tension on the pattern. Collapse of the pattern may potentially occur as a result.

It is therefore one object of the present invention to provide a substrate processing method that can shorten the time required for formation of a liquid film of a low surface tension liquid, and can satisfactorily remove the liquid film.

The present invention provides a substrate processing method including a substrate holding step of holding a substrate horizontally, a processing liquid supply step of supplying a processing liquid containing a water, onto the horizontally held substrate, a substrate rotating step of rotating the horizontally held substrate, a liquid film forming step of supplying a low surface tension liquid having lower surface tension than water onto the upper surface of the horizontally held substrate while rotating the substrate at a first rotational speed, in order to replace the processing liquid on the substrate with the low surface tension liquid and form a liquid film of the low surface tension liquid on the upper surface of the substrate, a rotation decelerating step of decelerating rotation of the horizontally held substrate to a second rotational speed that is a lower speed than the first rotational speed while continuing the liquid film forming step, after the processing liquid on the horizontally held substrate has been replaced with the low surface tension liquid having lower surface tension than water, an opening forming step of forming an opening in the center region of the liquid film on the substrate that rotates at the second rotational speed after completion of the liquid film forming step, and a liquid film removing step of removing the liquid film from the upper surface of the substrate by widening the opening.

According to this method, in the liquid film forming step, a low surface tension liquid having lower surface tension than water is supplied to the substrate that is rotating at the first rotational speed that is a relatively high speed. After the processing liquid on the substrate has been replaced with the low surface tension liquid, and while continuing the liquid film forming step, rotation of the substrate is decelerated to the second rotational speed that is a lower speed than the first rotational speed. Consequently, since the centrifugal force acting on the processing liquid is great in comparison to a substrate processing in which rotation of the substrate is accelerated in a stepwise manner when the processing liquid on the substrate is replaced with the low surface tension liquid, the time required until the processing liquid on the substrate is replaced with the low surface tension liquid is shortened. Stated differently, the time until formation of the liquid film of the low surface tension liquid is shortened.

Incidentally, the centrifugal force acting on the low surface tension liquid on the substrate that rotates at the first rotational speed is as great as the centrifugal force acting on the processing liquid on the substrate. However, the low surface tension liquid continues to be supplied onto the upper surface of the substrate when the processing liquid on the substrate is replaced with the low surface tension liquid. Disruption of the liquid film during formation can therefore be minimized.

Furthermore, after completion of the liquid film forming step, the opening is formed in the center region of the liquid film in a state where the rotational speed of the substrate is kept at the second rotational speed. Thus, the centrifugal force acting on the liquid film is lowered in comparison to substrate processing in which rotation of the substrate is accelerated in the opening forming step or liquid film removing step. Therefore, disruption of the liquid film is minimized and the liquid film is satisfactorily removed from the upper surface of the substrate.

As described above, the time required for formation of the liquid film of the low surface tension liquid can be shortened and the liquid film can be satisfactorily removed.

In a preferred embodiment of the present invention, the first rotational speed is a speed at which the processing liquid is spun off outward from the horizontally held substrate. According to this method, the processing liquid is spun off outward from the substrate, and therefore the processing liquid on the substrate is rapidly replaced by the low surface tension liquid.

In a preferred embodiment of the present invention, the second rotational speed is a speed at which the liquid film is held on the substrate. According to this method, the liquid film is held on the substrate, and therefore disruption of the liquid film is minimized.

In a preferred embodiment of the present invention, the substrate rotating step includes a step of rotating the substrate at a first processing liquid speed while supplying the processing liquid that contains the water, onto the upper surface of the horizontally held substrate. The substrate processing method further includes a substrate accelerating step of accelerating rotation of the substrate that rotates at the first processing liquid speed, to a second processing liquid speed that is a faster speed than the first processing liquid speed.

According to this method, the substrate is rotated at the first processing liquid speed while the processing liquid is supplied to the upper surface of the substrate, after which rotation of the substrate is accelerated to the second processing liquid speed which is a higher speed than the first processing liquid speed. Processing of the upper surface of the substrate by the processing liquid is therefore carried out rapidly.

In a preferred embodiment of the present invention, the second processing liquid speed is the same speed as the first rotational speed. According to this method, the second processing liquid speed is the same speed as the first rotational speed, and therefore the processing liquid on the substrate is replaced with the low surface tension liquid while keeping the rotational speed of the substrate at a high speed. The time required to change the rotational speed of the substrate is thus reduced. Consequently, the processing liquid on the substrate is rapidly replaced by the low surface tension liquid.

In a preferred embodiment of the present invention, the substrate processing method further includes a substrate heating step of heating the substrate in a state where the liquid film is held on the upper surface. The substrate heating step also includes a heating interrupting step of interrupting heating of the horizontally held substrate while the opening forming step is carried out.

According to this method, the substrate is heated while the liquid film is held on the upper surface, and vaporization of the low surface tension liquid in the liquid film is thereby accelerated. On the other hand, in a state where the opening forming step is carried out, heating of the substrate is interrupted. Consequently, an opening is satisfactorily formed in the center region of the liquid film and the low surface tension liquid is moderately vaporized. The liquid film on the substrate is therefore rapidly removed by centrifugal force of rotation of the substrate, and vaporization of the low surface tension liquid by heating of the substrate. The liquid film on the upper surface of the substrate is satisfactorily removed as a result.

In a preferred embodiment of the present invention, the substrate heating step includes a heating resuming step of resuming heating of the horizontally held substrate, after completion of the opening forming step.

According to this method, heating of the substrate is resumed after completion of the opening forming step, and therefore vaporization of the low surface tension liquid in the liquid film is accelerated even further after completion of the opening forming step. The liquid film on the upper surface of the substrate is even more satisfactorily removed as a result.

In a preferred embodiment of the present invention, the substrate heating step is initiated after completion of the rotation decelerating step. According to this method, the substrate heating step is initiated after completion of the rotation decelerating step. That is, heating of the substrate is interrupted while the substrate is rotated at a relatively high speed. Consequently, the liquid film is rapidly formed, and exposure of the upper surface of the substrate due to disappearance of the low surface tension liquid from the substrate before the opening forming step is minimized.

In a preferred embodiment of the present invention, the opening forming step includes an inert gas blowing step of blowing an inert gas toward the center region of the liquid film. According to this method, by blowing of an inert gas, the opening is instantaneously formed in the center region of the liquid film without leaving droplets.

In a preferred embodiment of the present invention, the substrate processing method further includes a low surface tension liquid supply step of supplying a low surface tension liquid having a lower surface tension than water onto the upper surface of the horizontally held substrate at a position further outward than the opening.

According to this method, the low surface tension liquid is supplied onto the upper surface of the substrate at a position further outward than the opening, and therefore disruption of the liquid film caused by local vaporization of the low surface tension liquid on the outer side of the opening is minimized.

In a preferred embodiment of the present invention, the substrate processing method further includes a step of moving the position on the upper surface of the horizontally held substrate, to which the low surface tension liquid having a lower surface tension than water is supplied, so as to follow widening of the opening.

According to this method, by moving the position on the upper surface of the substrate, to which the low surface tension liquid is supplied, so as to follow widening of the opening, the low surface tension liquid continues to be supplied to a position further outward than the opening, regardless of the size of the opening. Consequently, disruption of the liquid film caused by local vaporization of the low surface tension liquid on the outer side of the opening is further minimized.

The above and other elements, features, steps, characteristics and advantages of the present invention will become more apparent from the following detailed description of preferred embodiments with reference to the attached drawings.

BRIEF DESCRIPTION OF THE DRAWINGS

FIG. 6 is a time chart for explaining the details of substrate processing.

DETAILED DESCRIPTION OF THE PREFERRED EMBODIMENTS

First Preferred Embodiment

Figure 1:
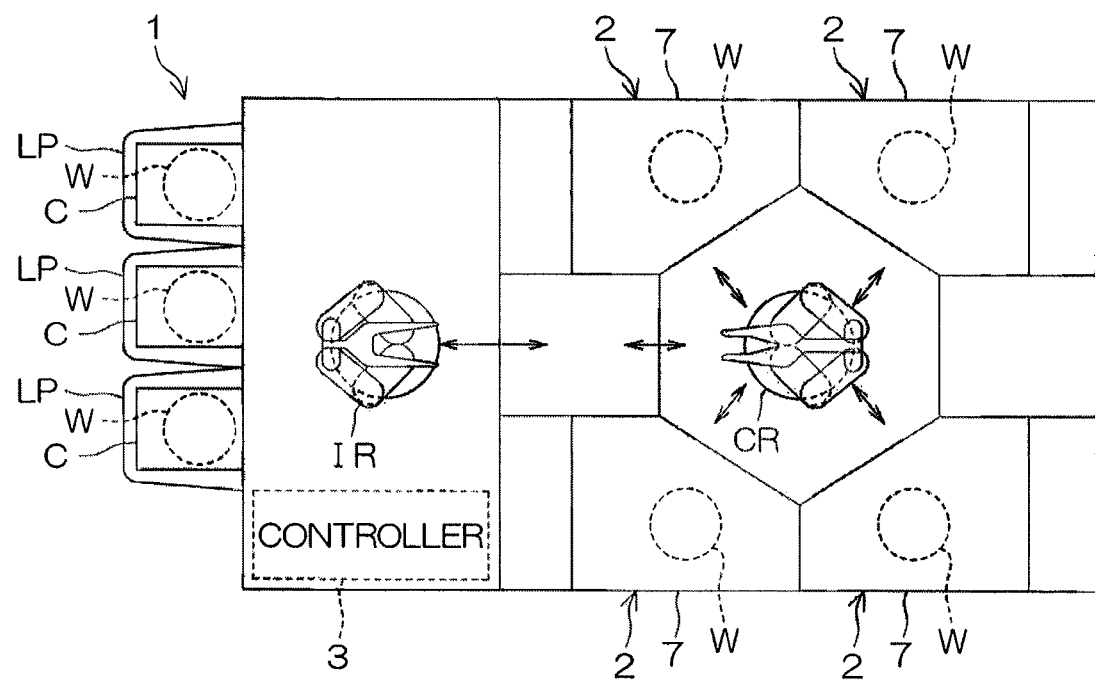
FIG. 1 is an illustrative plan view for explaining a layout of the interior of a substrate processing apparatus according to a first preferred embodiment of the present invention.
Figure 10:
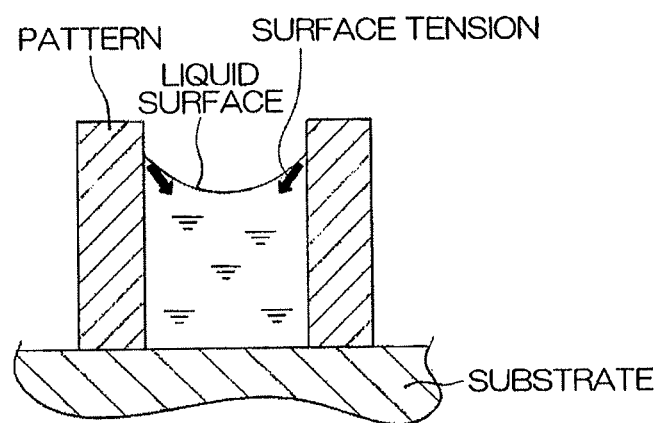
FIG. 10 is an illustrative sectional view for explaining principles of pattern collapse due to surface tension.

FIG. 1 is an illustrative plan view for explaining a layout of the interior of a substrate processing apparatus 1 according to a first preferred embodiment of the present invention. The substrate processing apparatus 1 is a single substrate processing type apparatus that processes substrates W such as silicon wafers one by one. In this preferred embodiment, each of the substrates W is a circular substrate. A fine pattern is formed on the front surface of the substrate W (refer to FIG. 10).

The substrate processing apparatus 1 includes a plurality of processing units 2 that process the substrates W, a plurality of load ports LP that respectively hold carriers C housing the plurality of substrates W to be processed by the processing units 2, transfer robots IR and CR that transfer the substrates W between the load ports LP and the processing units 2, and a controller 3 that controls the substrate processing apparatus 1. The transfer robot IR transfers the substrates W between the carriers C and the transfer robot CR. The transfer robot CR transfers the substrates W between the transfer robot IR and the processing units 2. The plurality of processing units 2 may have the same configuration, for example.

Figure 2:
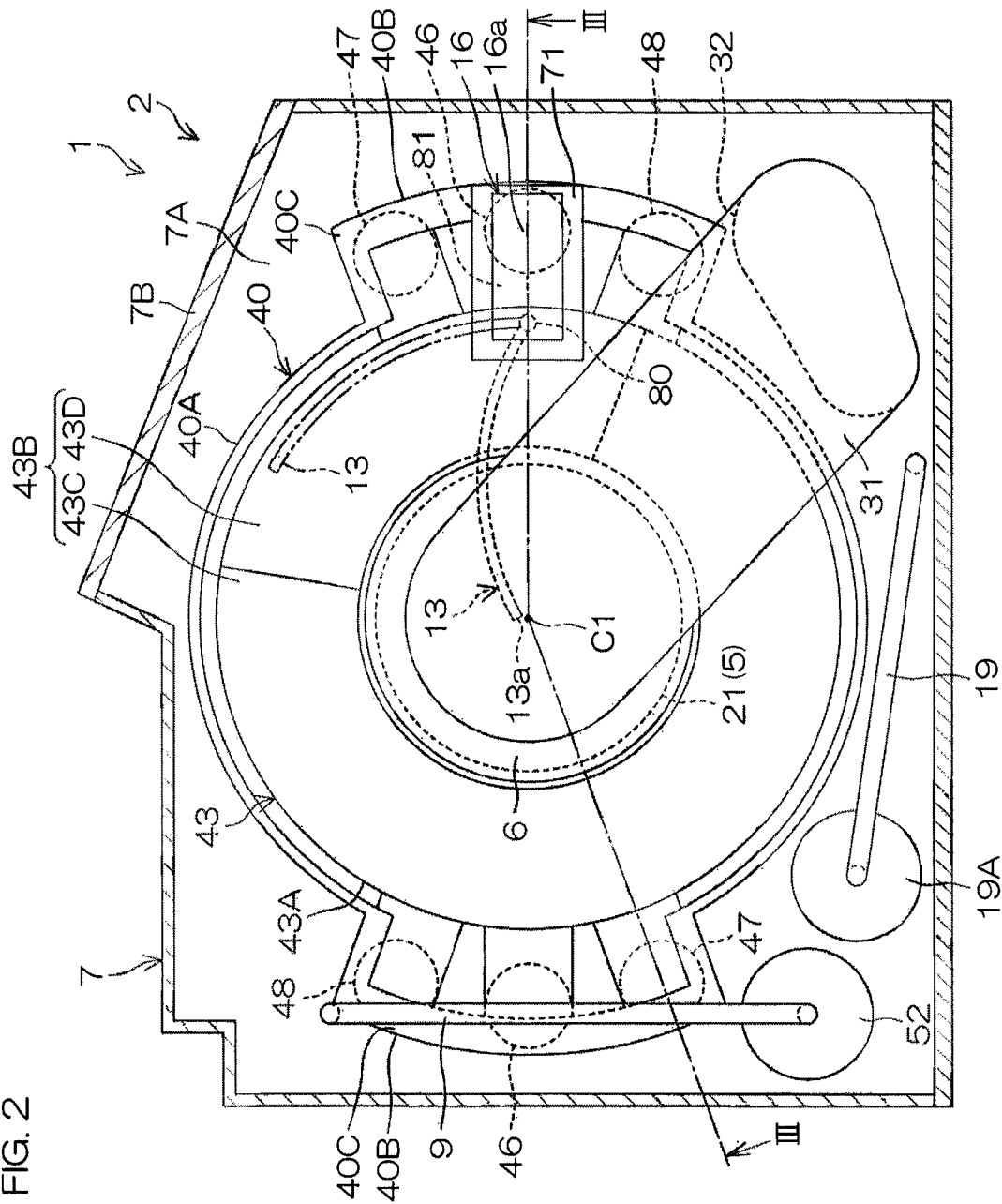
FIG. 2 is an illustrative lateral cross-sectional view for explaining a configuration example of a processing unit provided in the substrate processing apparatus.
Figure 3:
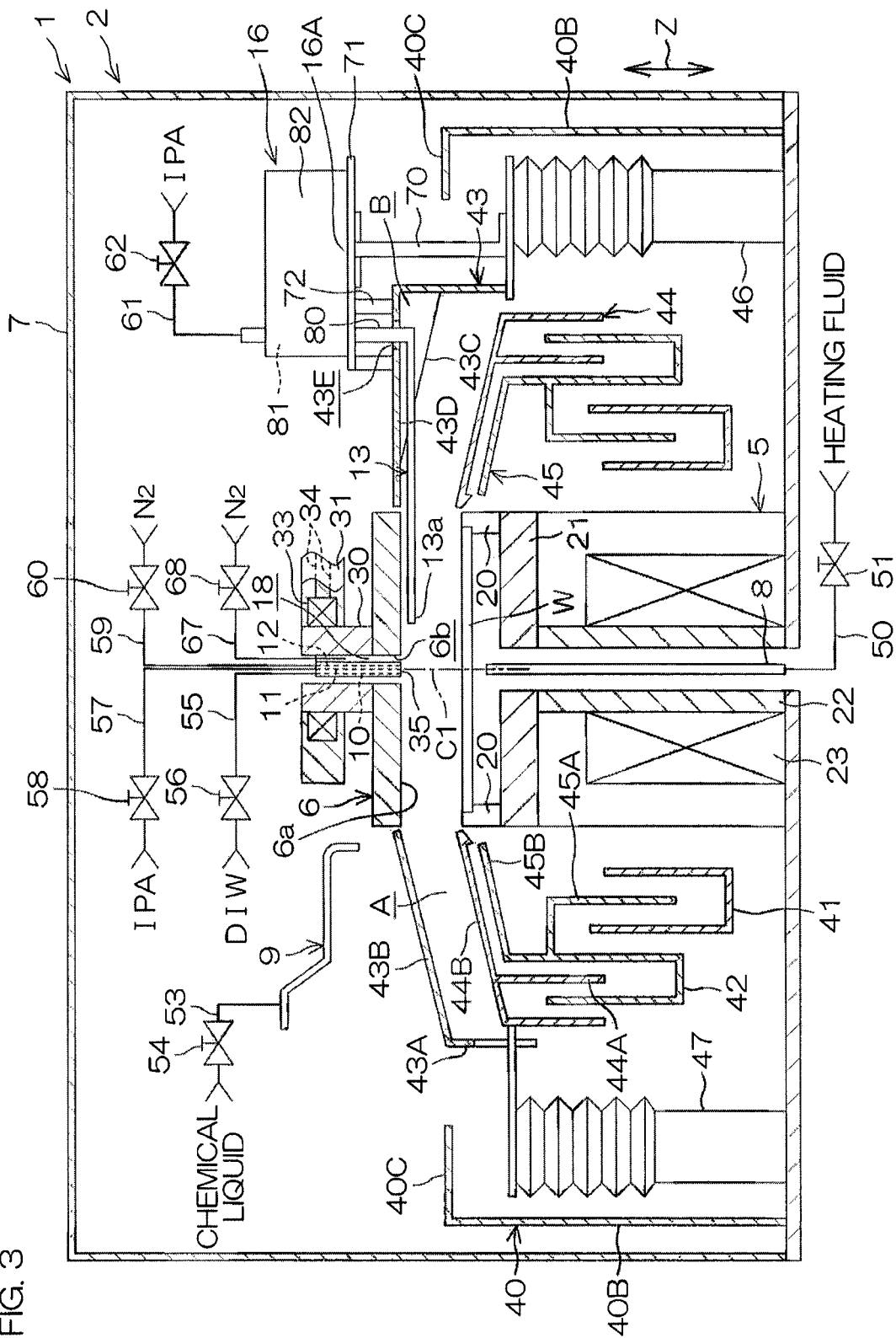
FIG. 3 corresponds to a vertically sectional view taken along line in FIG. 2 and is a schematic view for explaining the configuration example of the processing unit.

FIG. 2 is an illustrative lateral cross-sectional view for explaining a configuration example of the processing unit 2. FIG. 3 corresponds to a vertically sectional view taken along line in FIG. 2. FIG. 3 is a schematic view for explaining the configuration example of the processing unit 2.

The processing unit 2 includes a spin chuck 5 that rotates a single substrate W around a vertical rotational axis C1 running through the center of the substrate W while holding the substrate W in a horizontal orientation. The spin chuck 5 is an example of a substrate holding unit that holds the substrate W horizontally. The processing unit 2 further includes a shielding member 6 having a facing surface 6a which faces the upper surface of the substrate W (the main surface on the upper side), and a chamber 7 housing the substrate W for processing the substrate W with the processing liquid. The shielding member 6 is an example of a facing member. In the chamber 7, a carry-in/carry-out port 7A for carrying in and carrying out the substrate W is formed. The chamber 7 includes a shutter unit 7B that opens and closes the carry-in/carry-out port 7A.

The spin chuck 5 includes chuck pins 20, a spin base 21, a rotating shaft 22, and an electric motor 23 that rotates the rotating shaft 22 around the rotational axis C1.

The rotating shaft 22 extends in the vertical direction along the rotational axis C1 (also referred to as the vertical direction Z). In this preferred embodiment, the rotating shaft 22 is a hollow shaft. The upper end of the rotating shaft 22 is coupled to the center of the lower surface of the spin base 21. The spin base 21 has a disk shape along the horizontal direction. The plurality of chuck pins 20 that grip the substrate W are disposed at intervals in the circumferential direction in the peripheral edge portion of the upper surface of the spin base 21. By rotating the rotating shaft 22 by the electric motor 23, the substrate W is rotated around the rotational axis C1. Hereinafter, the inner side in the rotation radial direction of the substrate W shall be referred to simply as the "radially inner side," and the outer side in the rotation radial direction of the substrate W shall be referred to simply as the "radially outer side."

The shielding member 6 is formed as a disk shape having the substantially same diameter as the substrate W or the larger diameter than the substrate W. The shielding member 6 is disposed substantially horizontally above the spin chuck 5. A hollow shaft 30 is fixed to the surface of the shielding member 6 on the opposite side of the facing surface 6a. In the portion of the shielding member 6 including a position overlapping with the rotational axis C1 in plan view, a communicating hole 6b that runs vertically through the shielding member 6 and communicates with the interior space of the hollow shaft 30 is formed.

The processing unit 2 further includes a shielding member support member 31, a shielding member raising/lowering mechanism 32, and a shielding member rotating mechanism 33. The shielding member support member 31 extends horizontally and supports the shielding member 6 via the hollow shaft 30. The shielding member raising/lowering mechanism 32 is coupled to the shielding member 6 via the shielding member support member 31 and drives raising and lowering of the shielding member 6. The shielding member rotating mechanism 33 rotates the shielding member 6 around the rotational axis C1.

The shielding member raising/lowering mechanism 32 can position the shielding member 6 at any desired position (height) from a lower position to a higher position. The lower position is a position within the movable range of the shielding member 6, at which the facing surface 6a of the shielding member 6 is the closest to the substrate W. In a state where the shielding member 6 is positioned at the lower position, a distance between the upper surface of the substrate W and the facing surface 6a is 0.5 mm, for example.

The higher position is a position within the movable range of the shielding member 6, at which the facing surface 6a of the shielding member 6 is the most distant from the substrate W. In a state where the shielding member 6 is positioned at the higher position, the distance between the upper surface of the substrate W and the facing surface 6a is 80 mm, for example.

The shielding member rotating mechanism 33 includes an electric motor built into the tip of the shielding member support member 31. A plurality of wirings 34 disposed inside the shielding member support member 31 are connected to the electric motor. The plurality of wirings 34 include a power line for power transmission to the electric motor, and an encoder line for output of rotational information of the shielding member 6. By detecting the rotational information of the shielding member 6, rotation of the shielding member 6 can be accurately controlled.

The processing unit 2 further includes an exhaust bucket 40 that surrounds the spin chuck 5, a plurality of cups 41, 42 (a first cup 41 and a second cup 42) disposed between the spin chuck 5 and the exhaust bucket 40, and a plurality of guards 43 to 45 (a first guard 43, a second guard 44, and a third guard 45) that receive the processing liquid removed to a outside of the substrate W from the substrate W held by the spin chuck 5.

The processing unit 2 further includes a plurality of guard raising/lowering mechanisms 46 to 48 (a first guard raising/lowering mechanisms 46, a second guard raising/lowering mechanisms 47, and a third guard raising/lowering mechanisms 48) that drive raising and lowering of the plurality of guards 43 to 45, respectively. In the present preferred embodiment, each pair of the guard raising/lowering mechanisms 46 to 48 is provided in point symmetry with respect to the rotational axis C1 of the substrate W in plan view. Thereby, the plurality of guards 43 to 45 can be respectively stably raised and lowered.

The exhaust bucket 40 includes a cylinder portion 40A of a cylindrical shape, a plurality of (two, in the present preferred embodiment) projecting portions 40B projecting from the cylinder portion 40A to the radially outer side of the cylinder portion 40A, and a plurality of lid portions 40C attached to the upper ends of the plurality of projecting portions 40B. The plurality of guard raising/lowering mechanisms 46 to 48 are disposed at the same positions as the projecting portions 40B in the circumferential direction of the cylinder portion 40A, further to the radially inner side than the projecting portions 40B. In detail, one set of the first guard raising/lowering mechanism 46, the second guard raising/lowering mechanism 47, and the third guard raising/lowering mechanism 48 is disposed at the same position as each of the projecting portions 40B in the circumferential direction of the cylinder portion 40A.

Each of the cups 41, 42 has an annular groove opening upward. Each of the cups 41, 42 surrounds the spin chuck 5 further to the radially inner side than the cylinder portion 40A of the exhaust bucket 40. The second cup 42 is disposed further to the radially outer side than the first cup 41. The second cup 42 is integrated with the third guard 45, for example. The second cup 42 is raised and lowered together with the third guard 45. A waste liquid piping (not shown) or a discharge piping (not shown) is connected to the groove of each of the cups 41, 42. The processing liquid guided to a bottom portion of each of the cups 41, 42 is recovered or discarded through the waste liquid piping or the discharge piping.

The guards 43 to 45 are disposed so as to surround the spin chuck 5 and the shielding member 6 in plan view.

The first guard 43 includes a first cylindrical portion 43A that surrounds the spin chuck 5 further to the radially inner side than the cylinder portion 40A of the exhaust bucket 40, and a first extension portion 43B extending to the radially inner side from the first cylindrical portion 43A.

The first guard 43 is raised and lowered between a lower position and a higher position by the first guard raising/lowering mechanisms 46. When the first guard 43 is positioned at the lower position, the upper end (the radially inner side end) of the first guard 43 is positioned lower than the substrate W. When the first guard 43 is positioned at the higher position, the upper end (the radially inner side end) of the first guard 43 is positioned higher than the substrate W. By being raised and lowered by the first guard raising/lowering mechanisms 46, the first guard 43 can be positioned at a shielding member facing position and a substrate facing position between the lower position and the higher position. When the first guard 43 is positioned at the substrate facing position, (the radially inner side end of) the first extension portion 43B faces the substrate W from the horizontal direction. When the first guard 43 is positioned at the shielding member facing position, (the radially inner side end of) the first extension portion 43B faces the shielding member 6 from the horizontal direction.

When the first guard 43 is positioned at the shielding member, facing position, a space A where movement of the atmosphere in from and out to the outside of the space A is restricted, is formed by the first guard 43, together with the substrate W held on the spin chuck 5 and the shielding member 6. The outside of the space A is a space higher than the shielding member 6 and a space further to the radially outer side than the first guard 43. The space A only needs to be formed such that a flow of a fluid between the atmosphere inside the space A and the atmosphere outside the space A is restricted. The space A does not necessarily have to be formed such that the atmosphere inside the space A is completely shielded from the atmosphere outside the space A.

The second guard 44 includes a second cylindrical portion 44A that surrounds the spin chuck 5 further to the radially inner side than the first cylindrical portion 43A of the first guard 43, and a second extension portion 44B extending to the radially inner side from the second cylindrical portion 44A.

The second guard 44 is raised and lowered between a lower position and a higher position by the second guard raising/lowering mechanisms 47. When the second guard 44 is positioned at the lower position, the upper end (the radially inner side end) of the second guard 44 is positioned lower than the substrate W. When the second guard 44 is positioned at the higher position, the upper end (the radially inner side end) of the second guard 44 is positioned higher than the substrate W. By being raised and lowered by the second guard raising/lowering mechanisms 47, the second guard 44 can be positioned at a substrate facing position between the lower position and the higher position. When the second guard 44 is positioned at the substrate facing position, (the radially inner side end of) the second extension portion 44B faces the substrate W from the horizontal direction. The second extension portion 44B faces the first extension portion 43B from the lower side. When the second guard 44 is positioned at the substrate facing position, the space A is partitioned by the second guard 44 from the lower side.

The third guard 45 includes a third cylindrical portion 45A that surrounds the spin chuck 5 further to the radially inner side of the second cylindrical portion 44A of the second guard 44, and a third extension portion 45B extending to the radially inner side from the third cylindrical portion 45A. The third extension portion 45B faces the second extension portion 44B from the lower side.

The third guard 45 is raised and lowered between a lower position and a higher position by the third guard raising/lowering mechanisms 48 (refer to FIG. 2). When the third guard 45 is positioned at the lower position, the upper end (the radially inner side end) of the third guard 45 is positioned lower than the substrate W. When the third guard 45 is positioned at the higher position, the third guard 45 is positioned higher than the substrate W. By being raised and lowered by the third guard raising/lowering mechanisms 48, the third guard 45 can be positioned at a substrate facing position between the lower position and the higher position. When the third guard 45 is positioned at the substrate facing position, (the radially inner side end of) the third extension portion 45B faces the substrate W from the horizontal direction.

The processing unit 2 includes a lower surface nozzle 8 that supplies a heating fluid to the lower surface of the substrate W, and a chemical liquid nozzle 9 that supplies a chemical liquid such as hydrofluoric acid to the upper surface of the substrate W.

The lower surface nozzle 8 is inserted through the rotating shaft 22. The lower surface nozzle 8 has a discharge port facing the center of the lower surface of the substrate W at the upper end. A heating fluid such as hot water is supplied from a heating fluid supply source to the lower surface nozzle 8 via a heating fluid supply pipe 50. The heating fluid supply pipe 50 is provided with a heating fluid valve 51 that opens and closes a flow passage of the heating fluid supply pipe 50. Hot water is water at a higher temperature than room temperature, such as 80° C. to 85° C. The heating fluid is not limited to hot water but may be a gas such as a high-temperature nitrogen gas. In short, the heating fluid may be a fluid that is capable of heating the substrate W.

The chemical liquid is supplied from a chemical liquid supply source to the chemical liquid nozzle 9 via a chemical liquid supply pipe 53. A chemical liquid valve 54 that opens and closes a flow passage of the chemical liquid supply pipe 53 is interposed in the chemical liquid pipe 53.

The chemical liquid is not limited to hydrofluoric acid but may be a liquid containing at least one of sulfuric acid, acetic acid, nitric acid, hydrochloric acid, hydrofluoric acid, ammonia water, hydrogen peroxide water, organic acids (such as citric acid, oxalic acid, etc.), organic alkalis (such as TMAH: tetramethylammonium hydroxide, etc.), surfactants, and corrosion inhibitors. Examples of a chemical liquid containing mixture of these include SPM (sulfuric acid/hydrogen peroxide mixture) and SC1 (ammonia-hydrogen peroxide mixture), etc.

The chemical liquid nozzle 9 is moved in the vertical direction and the horizontal direction by a chemical liquid nozzle moving mechanism 52 (refer to FIG. 2). The chemical liquid nozzle 9 is moved between a center position and a retreat position by movement in the horizontal direction. When the chemical liquid nozzle 9 is positioned at the center position, the chemical liquid nozzle 9 faces a rotation center position of the upper surface of the substrate W. When the chemical liquid nozzle 9 is positioned at the retreat position, the chemical liquid nozzle 9 does not face the upper surface of the substrate W. The rotation center position of the upper surface of the substrate W is a position of the upper surface of the substrate W, the position crossing the rotational axis C1. The retreat position is a position on the outer side of the spin base 21 in plan view.

The processing unit 2 further includes a DIW nozzle 10, a central IPA nozzle 11, and an inert gas nozzle 12. The DIW nozzle 10 supplies deionized water (DIW) serving as a processing liquid to a center region of the upper surface of the substrate W. The central IPA nozzle 11 supplies IPA serving as a low surface tension liquid having lower surface tension than water to the center region of the upper surface of the substrate W. The inert gas nozzle 12 supplies an inert gas such as a nitrogen gas (N2) to the center region of the upper surface of the substrate W. The center region of the upper surface of the substrate W is a region around the center of the upper surface of the substrate W. The center region of the upper surface of the substrate W includes the position crossing the rotational axis C1 on the upper surface of the substrate W.

In this preferred embodiment, the nozzles 10 to 12 are housed in common in a nozzle housing member 35 inserted through the interior space of the hollow shaft 30 and the communicating hole 6b of the shielding member 6. The nozzles 10 to 12 can discharge the DIW, the IPA, and the inert gas, respectively. The tips of the respective nozzles 10 to 12 are disposed at heights substantially equal to the facing surface 6a of the shielding member 6. Even in a state where the space A is formed, the respective nozzles 10 to 12 can supply the DIW, the IPA, and the inert gas, respectively, to the center region of the upper surface of the substrate W.

The DIW is supplied from a DIW supply source to the DIW nozzle 10 via a DIW supply pipe 55. A DIW valve 56 that opens and closes a flow passage in the DIW supply pipe 55 is interposed in the DIW supply pipe 55.

The DIW nozzle 10 may also be a processing liquid nozzle that supplies a processing liquid other than the DIW. The DIW nozzle 10 is an example of a processing liquid supply unit. The processing liquid includes a rinse liquid. Examples of a rinse liquid other than the DIW include carbonated water, electrolyzed ion water, ozone water, aqueous hydrochloric acid solutions of dilute concentration (of about 10 to 100 ppm, for example), and reduced water (hydrogen water), etc.

The IPA is supplied from an IPA supply source to the central IPA nozzle 11 via a central IPA supply pipe 57. A central IPA valve 58 that opens and closes a flow passage in the central IPA supply pipe 57 is interposed in the central IPA supply pipe 57.

In the present preferred embodiment, the central IPA nozzle 11 is configured to supply the IPA. The central IPA nozzle 11 only needs to function as a central low surface tension liquid nozzle that supplies a low surface tension liquid with lower surface tension than water to the center region of the upper surface of the substrate W.

As the low surface tension liquid, an organic solvent other than the IPA, which does not chemically react (or has low reactivity) with the upper surface of the substrate W and the pattern formed on the substrate W (refer to FIG. 10) can be used. More specifically, a liquid including at least one of the IPA, HFE (hydrofluoroether), methanol, ethanol, acetone, and trans-1,2-dichloroethylene can be used as the low surface tension liquid. In addition, the low surface tension liquid does not need to be composed of a single component only, but may be a liquid mixture with other components. For example, the low surface tension liquid may be a mixture of an IPA solution and purified water, or a mixture of an IPA solution and an HFE solution.

The inert gas such as the nitrogen gas is supplied from an inert gas supply source to the inert gas nozzle 12 via a first inert gas supply pipe 59. A first inert gas valve 60 that opens and closes a flow passage of the first inert gas supply pipe 59 is interposed in the first inert gas supply pipe 59. The inert gas is a gas which is inert to the upper surface of the substrate W and the pattern. The inert gas is not limited to the nitrogen gas but may be a rare gas such as argon, for example.

By a space between an outer peripheral surface of the nozzle housing member 35, and an inner peripheral surface of the hollow shaft 30 and a surface partitioning the communicating hole 6b in the shielding member 6, an inert gas flow channel 18 through which the inert gas is supplied to the center region of the substrate W is formed. The inert gas such as the nitrogen gas is supplied from an inert gas supply source to the inert gas flow channel 18 via a second inert gas supply pipe 67. The second inert gas supply pipe 67 is provided with a second inert gas valve 68 that opens and closes a flow passage in the second inert gas supply pipe 67. The inert gas supplied to the inert gas flow channel 18 is discharged from the lower end of the communicating hole 6b toward the upper surface of the substrate W.

The processing unit 2 may further include a moving nozzle 19 that supplies a chemical liquid, rinse liquid or a low surface tension liquid to the upper surface of the substrate W (refer to FIG. 2). The moving nozzle 19 is moved in the vertical direction and the horizontal direction by a moving nozzle moving mechanism 19A (refer to FIG. 2).

The processing unit 2 further includes an IPA nozzle 13 that supplies a low surface tension liquid such as IPA to the upper surface of the substrate W.

The IPA nozzle 13 is an example of a low surface tension liquid supply unit that supplies a low surface tension liquid to the upper surface of the substrate W. The IPA nozzle 13 extends from the inner wall of the first guard 43, so as to be disposed in the space A in a state where the space A is formed.

The IPA is supplied from an IPA supply source to the IPA nozzle 13 via an IPA supply pipe 61. An IPA valve 62 that opens and closes a flow passage of the IPA supply pipe 61 is interposed in the IPA supply pipe 61.

Referring to FIG. 2, the IPA nozzle 13 extends in the horizontal direction and is curved in plan view. In detail, the IPA nozzle 13 has an arc shape following the first cylindrical portion 43A of the first guard 43. A discharge port 13a that discharges the IPA toward the upper surface of the substrate W in the vertical direction (downward) is provided in the tip of the IPA nozzle 13.

Referring to FIG. 3, the processing unit 2 further includes an IPA nozzle moving mechanism 16 coupled to the first guard 43, that moves the IPA nozzle 13 in the horizontal direction between the upper surface of the substrate W and the facing surface 6a of the shielding member 6.

The IPA nozzle 13 is moved between a center position and a retreat position by the IPA nozzle moving mechanism 16. When the IPA nozzle 13 is positioned at the center position, the IPA nozzle 13 faces the rotation center position of the upper surface of the substrate W. When the IPA nozzle 13 is positioned at the retreat position, the IPA nozzle 13 does not face the upper surface of the substrate W. The retreat position is a position on the outer side than the spin base 21 in plan view. The retreat position of the IPA nozzle 13 may be a position adjacent to the first cylindrical portion 43A of the first guard 43 from the radially inner side.

The IPA nozzle moving mechanism 16 includes a support member 80 that supports the IPA nozzle 13, a driving mechanism 81 that is coupled to the first guard 43 and drives the support member 80, and a cover 82 that covers at least a portion of the driving mechanism 81. The support member 80 has the form of a rotating shaft that is driven by the driving mechanism 81 to rotate around a prescribed central axis.

The upper end of the support member 80 is positioned higher than the cover 82. The IPA nozzle 13 and the support member 80 may be formed integrally. The support member 80 and the IPA nozzle 13 have the form of hollow shafts. The interior space of the support member 80 and the interior space of the IPA nozzle 13 communicate with each other. The IPA supply pipe 61 is inserted through the support member 80 from the upper side.

The first extension portion 43B of the first guard 43 integrally includes an inclined section 43C that is inclined with respect to the horizontal direction, and a flat section 43D that is flat in the horizontal direction. The flat section 43D and the inclined section 43C are disposed side by side in the rotational direction of the substrate W (refer to FIG. 2). The flat section 43D projects higher than the inclined section 43C such that the flat section is positioned higher than the inclined section 43C as the flat section 43D approaches the radially outer side. The flat section 43D is disposed so as to overlap with the support member 80 and with the IPA nozzle 13 that is positioned on the outer side of the spin base 21 in plan view. The flat section 43D only needs to be disposed so as to overlap at least with the IPA nozzle 13 at the retreat position and the support member 80 in plan view.

The second extension portion 44B of the second guard 44 faces the flat section 43D from the lower side. Between the first guard 43 and the second guard 44, a housing space B where the IPA nozzle 13 can be housed is formed. The housing space B extends in the rotational direction of the substrate W following the first cylindrical portion 43A of the first guard 43, and has an arc shape in plan view. The housing space B is a space partitioned by the first cylindrical portion 43A, the flat section 43D, and the second extension portion 44B. In detail, the housing space B is partitioned from the radially outer side by the first cylindrical portion 43A, partitioned from the upper side by the flat section 43D, and partitioned from the lower side by the second extension portion 44B. When the IPA nozzle 13 is positioned at the retreat position, the IPA nozzle 13 is housed in the housing space B and is close to the flat section 43D from the lower side. The second extension portion 44B is inclined with respect to the horizontal direction, so as to rise upward as the second extension portion 44B goes toward the radially inner side. Thus, the housing space B is maintained even when the second extension portion 44B is adjacent to the first extension portion 43B from the lower side.

A penetrating hole 43E running through the flat section 43D in the vertical direction Z is formed in the flat section 43D of the first guard 43. The support member 80 is inserted through the penetrating hole 43E. A sealing member made of rubber, etc., (not shown) is disposed between the support member 80 and the inner wall of the penetrating hole 43E. Thereby, a region between the support member 80 and the inner wall of the penetrating hole 43E is sealed. The driving mechanism 81 is disposed outside the space A.

The processing unit 2 further includes a first bracket 70, a pedestal 71, and a second bracket 72. The first bracket 70 is attached to the first guard raising/lowering mechanism 46 and fixes the IPA nozzle moving mechanism 16 to the first guard 43. The pedestal 71 is supported by the first bracket 70 and the driving mechanism 81 is mounted on and fixed to the pedestal 71. The second bracket 72 is coupled to the first guard 43 and supports the pedestal 71 further to the radially inner side of the substrate W than the first bracket 70. In the IPA nozzle moving mechanism 16, a portion 16a fixed by the first bracket 70 overlaps with the first guard raising/lowering mechanism 46 in plan view.

Figure 4:
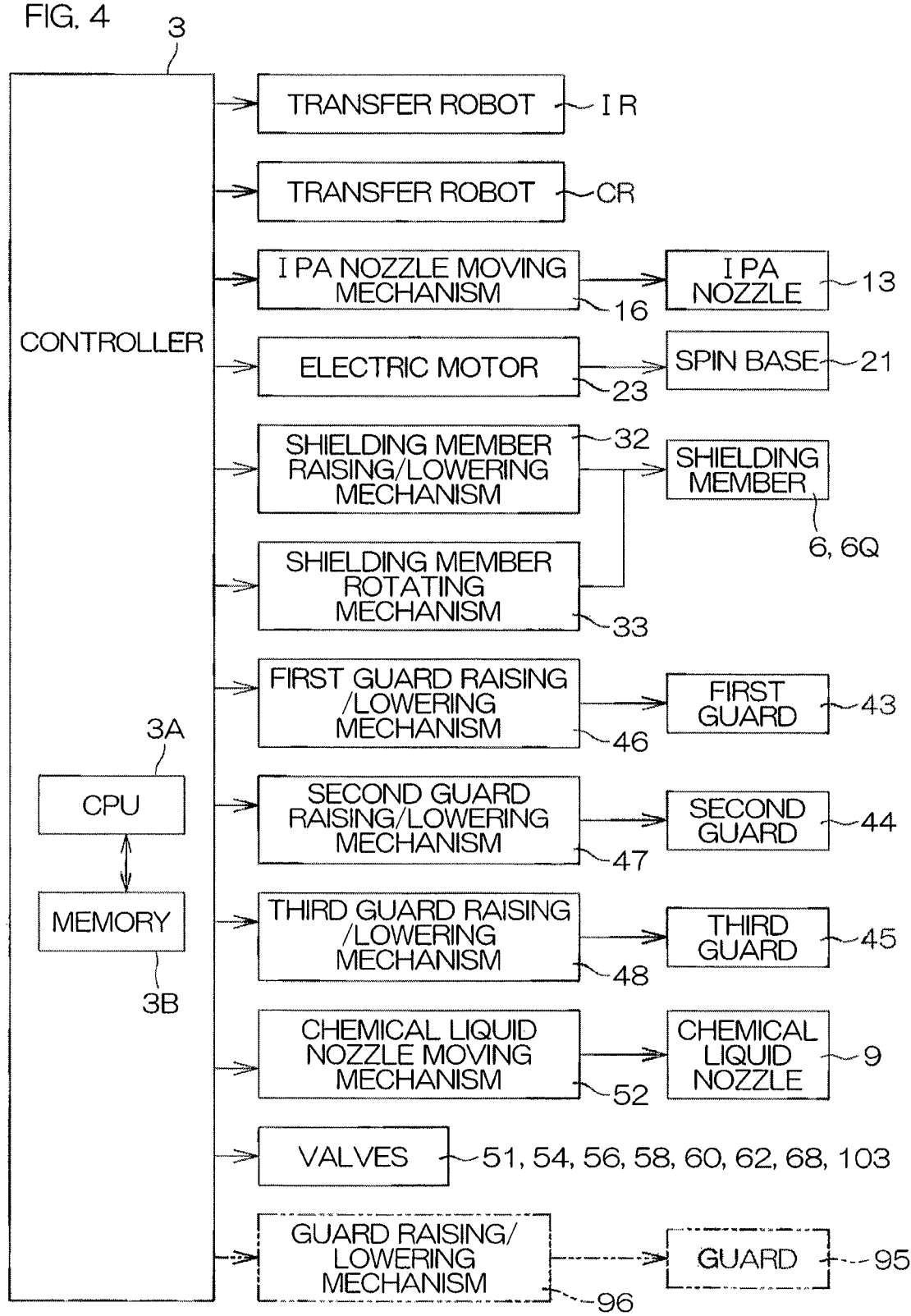
FIG. 4 is a block diagram for explaining an electrical configuration of the main portion of the substrate processing apparatus.

FIG. 4 is a block diagram for explaining an electrical configuration of the main portion of the substrate processing apparatus 1. The controller 3 includes a microcomputer, and controls control objects provided in the substrate processing apparatus 1 according to a prescribed control program. More specifically, the controller 3 includes a processor (CPU) 3A and a memory 3B in which the program is stored. The controller is configured to execute various controls for substrate processing by the processor 3A executing the program. In particular, the controller 3 controls actions of the transfer robots IR and CR, the IPA nozzle moving mechanism 16, the electric motor 23, the shielding member raising/lowering mechanism 32, the shielding member rotating mechanism 33, the guard raising/lowering mechanisms 46 to 48, the chemical liquid nozzle moving mechanism 52, and the valves 51, 54, 56, 58, 60, 62, 68, etc.

Figure 5:
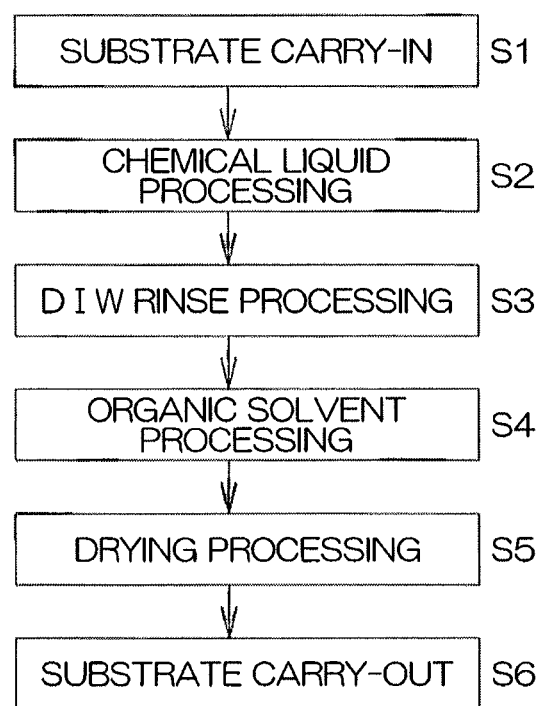
FIG. 5 is a flowchart for explaining an example of substrate processing performed by the substrate processing apparatus.

FIG. 5 is a flowchart for explaining an example of substrate processing performed by the substrate processing apparatus 1. The figure mainly shows processing to be realized by the controller 3 executing the program. FIG. 6 is a time chart for explaining the details of substrate processing.

In substrate processing by the substrate processing apparatus 1, carry-in of a substrate (S1), chemical liquid processing (S2), DIW rinse processing (S3), organic solvent processing (S4), drying processing (S5), and carry-out of the substrate (S6) are executed in this order as shown in FIG. 5, for example.

First, in substrate processing by the substrate processing apparatus 1, an unprocessed substrate W is carried from the carrier C into the processing unit 2 and delivered to the spin chuck 5 by the transfer robots IR and CR (S1). Then, the substrate W is held horizontally by the spin chuck 5 until the substrate W is carried out by the transfer robot CR (substrate holding step). The upper surface of the substrate W horizontally held on the spin chuck 5 faces the facing surface 6a of the shielding member 6.

Next, the chemical liquid processing (S2) will be described. After the transfer robot CR is retreated to the outside of the processing unit 2, the chemical liquid processing (S2) in which the upper surface of the substrate W is cleaned with the chemical liquid is carried out.

Referring to FIG. 6, specifically, the controller 3 first controls the IPA nozzle moving mechanism 16 to position the IPA nozzle 13 at the retreat position. In addition, the controller 3 controls the shielding member raising/lowering mechanism 32 to dispose the shielding member 6 at the higher position.

Then, the controller 3 drives the electric motor 23 to rotate the spin base 21 at 800 rpm, for example. The substrate W which is held horizontally thereby rotates at the same rotational speed as the spin base 21 (800 rpm) (substrate rotating step). Then, the controller 3 controls the shielding member rotating mechanism 33 to rotate the shielding member 6. During this time, the rotational direction of the shielding member 6 may be matched with the rotational direction of the substrate W, and the rotational speed of the shielding member 6 (the shielding member rotational speed) and the rotational speed of the substrate W (the substrate rotational speed) may be set to the same speed. In other words, the shielding member 6 may be rotated in synchronization with the spin base 21. The phrase "rotated in synchronization" means rotations in the same direction at the same rotational speed.

Then, the controller 3 controls the chemical liquid nozzle moving mechanism 52 to dispose the chemical liquid nozzle 9 at a chemical liquid processing position above the substrate W. The chemical liquid processing position may be a position where the chemical liquid discharged from the chemical liquid nozzle 9 is landed on the rotation center of the upper surface of the substrate W. The controller 3 opens the chemical liquid valve 54. Thereby, the chemical liquid is supplied from the chemical liquid nozzle 9 toward the upper surface of the substrate W which is in a rotating state. The supplied chemical liquid is spread over the entire upper surface of the substrate W by centrifugal force. At this time, the amount of the chemical liquid supplied from the chemical liquid nozzle 9 (chemical liquid supply amount) is 2 liter/min, for example.

The controller 3 controls the guard raising/lowering mechanisms 46 to 48 to dispose the third guard 45 higher than the substrate facing position. Consequently, the chemical liquid splashed outside the substrate W by centrifugal force passes under the third extension portion 45B of the third guard 45, and is received by the third cylindrical portion 45A of the third guard 45. The chemical liquid received by the third cylindrical portion 45A flows to the first cup 41 (refer to FIG. 3).

Next, the DIW rinse processing (S3) will be described. After chemical liquid processing (S2) for a fixed time period, the DIW rinse processing (S3) is carried out. In the DIW rinse processing (S3), the chemical liquid on the upper surface of the substrate W is replaced with the DIW, thereby the chemical liquid from the upper surface of the substrate W is removed.

Specifically, the controller 3 closes the chemical liquid valve 54. The controller 3 controls the chemical liquid nozzle moving mechanism 52 to retreat the chemical liquid nozzle 9 from the upper side of the substrate W to the side of the spin base 21.

Then, the controller 3 opens the DIW valve 56. The processing liquid such as DIW is thereby supplied from the processing liquid supply unit such as the DIW nozzle 10 toward the upper surface of the substrate W which is in a rotating state (processing liquid supply step). The DIW is spread over the entire upper surface of the substrate W by centrifugal force. The chemical liquid on the substrate W is washed off by the DIW. At this time, the amount of the DIW supplied from the DIW nozzle 10 (DIW supply amount) is 2 liter/min, for example.

The controller 3 controls the shielding member raising/lowering mechanism 32 to maintain a state with the shielding member 6 positioned at the higher position. Then, the controller 3 drives the electric motor 23 to keep the rotational speed of the spin base 21 at 800 rpm, for example. The controller 3 controls the shielding member rotating mechanism 33 to keep the rotational speed of the shielding member at 800 rpm, for example.

The controller 3 controls the guard raising/lowering mechanisms 46 to 48 to dispose the third guard 45 higher than the substrate facing position. Consequently, the chemical liquid and the DIW splashed outside the substrate W by centrifugal force passes under the third extension portion 45B of the third guard 45, and is received by the third cylindrical portion 45A of the third guard 45. The chemical liquid and the DIW received by the third cylindrical portion 45A flows to the first cup 41 (refer to FIG. 3).

In a state where the DIW is supplied from the DIW nozzle 10 toward the upper surface of the substrate W which is in a rotating state, the controller 3 controls the shielding member raising/lowering mechanism 32. The shielding member 6 is thereby moved from the higher position to a first proximal position. When the shielding member 6 is positioned at the first proximal position, the facing surface 6a of the shielding member 6 is proximal to the upper surface of the substrate W. When the shielding member 6 is positioned at the first proximal position, the distance between the upper surface of the substrate W and the facing surface 6a is 7 mm, for example.

After the shielding member 6 has been formed at the first proximal position, the controller 3 may control the first guard raising/lowering mechanism 46 to dispose the first guard 43 at the shielding member facing position. The space A is thereby formed by the substrate W, the shielding member 6, and the first guard 43 (space forming step).

Then, after the space A has been formed, the controller 3 opens the second inert gas valve 68, to supply inert gas from the inert gas flow channel 18 toward the upper surface of the substrate W. The flow rate of inert gas supplied from the inert gas flow channel 18 (the inert gas flow rate) is 300 liter/min, for example. The atmosphere in the space A is replaced by the inert gas supplied from the inert gas flow channel 18 (inert gas replacement step).

Then, after the space A has been formed, the controller 3 controls the electric motor 23 to rotate the spin base 21 at a first processing liquid speed and maintain this state for a prescribed time period. The substrate W is thereby rotated at the first processing liquid speed when the DIW is supplied from the DIW nozzle 10 onto the upper surface. The first processing liquid speed is 1200 rpm, for example. Thereafter, rotation of the spin base 21 is accelerated to a second processing liquid speed, which is a higher speed than the first processing liquid speed. Rotation of the substrate W is thereby accelerated to the second processing liquid speed (substrate accelerating step). The second processing liquid speed is a speed at which the processing liquid such as DIW on the substrate W can be rapidly spun off in the outward direction from the substrate W. The second processing liquid speed is 2000 rpm, for example. Unlike the present preferred embodiment, the spin base 21 may be rotated at the first processing liquid speed before the space A is formed, or rotation of the spin base 21 may be accelerated to the second processing liquid speed before the space A is formed.

Also, after the space A has been formed, the controller 3 may control the second guard raising/lowering mechanism 47 to dispose the second guard 44 at the substrate facing position. The space A is thereby partitioned from the lower side by the second extension portion 44B of the second guard 44. The controller 3 also controls the third guard raising/lowering mechanism 48 to dispose the third guard 45 lower than the substrate facing position.

The DIW that has splashed outside the substrate W by centrifugal force passes between the first extension portion 43B of the first guard 43 and the second extension portion 44B of the second guard 44, and is received by the first cylindrical portion 43A of the first guard 43. Unlike the present preferred embodiment, the DIW splashed outside the substrate by centrifugal force may be received by the second cylindrical portion 44A of the second guard 44. In this case, the controller 3 controls the guard raising/lowering mechanisms 46 to 48 to dispose the second guard 44 higher than the substrate facing position and dispose the third guard 45 lower than the substrate facing position. The DIW received by the second cylindrical portion 44A flows to the second cup 42 (refer to FIG. 3).

Net, the organic solvent processing (S4) will be described. After DIW rinse processing (S3) for a fixed time period, organic solvent processing (S4) is carried out. In the organic solvent processing (S4), the DIW on the substrate W is replaced with an organic solvent (for example, IPA) as a low surface tension liquid with lower surface tension than the rinse liquid (for example, water), to form an IPA liquid film, and thereafter the liquid film is removed from the substrate W.

FIG. 7A to FIG. 7D are illustrative cross-sectional views of the main part of the processing unit 2, for explaining the state of organic solvent processing (S4 in FIG. 5).

In the organic solvent processing (S4), an organic solvent rinsing step T1, a liquid film forming step T2, an opening forming step T3, and a liquid film removing step T4 are carried out in that order.

Figure 7A:
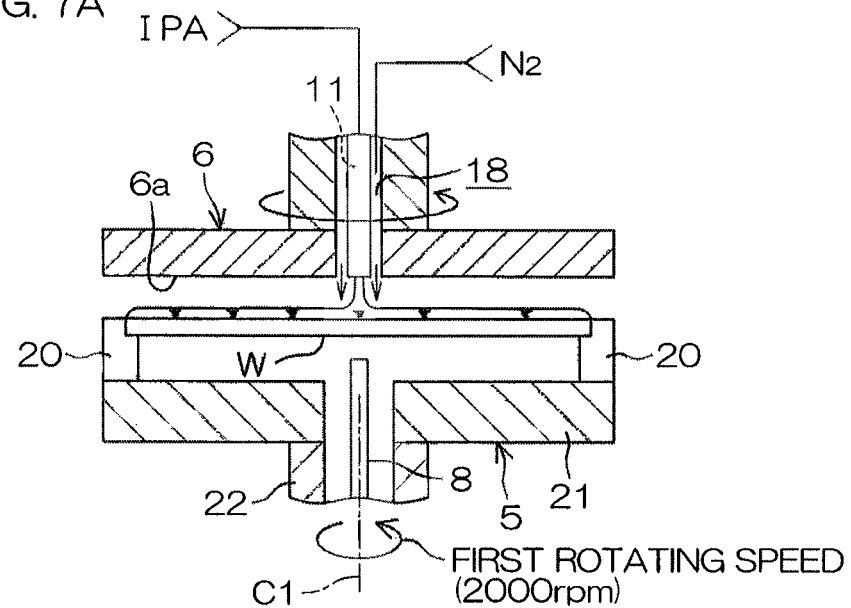
FIG. 7A to FIG. 7D are illustrative cross-sectional views for explaining the details of organic solvent processing (S4 in FIG. 5).

Referring to FIG. 6 and FIG. 7A, first, the organic solvent rinsing step T1 is carried out in the organic solvent processing (S4). In the organic solvent rinsing step T1, the DIW on the upper surface of the substrate W is replaced with an organic solvent such as IPA in state where the substrate W is being rotated.

The controller 3 closes the DIW valve 56. Thereby, supply of the DIW from the DIW nozzle 10 is interrupted. The controller 3 opens the central IPA valve 58. Thereby, the IPA is supplied from the central IPA nozzle 11 toward the upper surface of the substrate W which is in a rotating state (center low surface tension liquid supply step).

The controller 3 may control the shielding member raising/lowering mechanism 32 to keep the shielding member 6 positioned at the first proximal position, and may control the guard raising/lowering mechanisms 46 to 48 to keep the first guard 43 at the shielding member facing position. The state where the space A is formed by the substrate W, the shielding member 6, and the first guard 43 is thus maintained. When the second guard 44 is positioned higher than the substrate facing position at the end of the DIW rinse processing (S3), the controller 3 may control the second guard raising/lowering mechanisms 47 to move the second guard 44 to the substrate facing position.

The controller 3 controls the second inert gas valve 68, so that the flow rate of the inert gas is 50 liter/min, for example.

The controller 3 drives the electric motor 23 for high-speed rotation of the spin base 21 at a first rotational speed. The substrate W is thereby rotated at a high speed at the first rotational speed. The first rotational speed is a speed at which the processing liquid such as DIW can be spun off in the outward direction from the substrate W. The first rotational speed is 2000 rpm, for example, and the first rotational speed may be the same speed as the second processing liquid speed. That is, in the organic solvent rinsing step T1, the substrate W is rotated at high speed following the DIW rinse processing (S3). The IPA that has been supplied spreads rapidly over the entire upper surface of the substrate W by centrifugal force, and the DIW on the substrate W is replaced by the IPA. In the organic solvent rinsing step T1, the controller 3 may control the shielding member rotating mechanism 33, so that the shielding member rotational speed is 1000 rpm, for example.

Figure 7B:
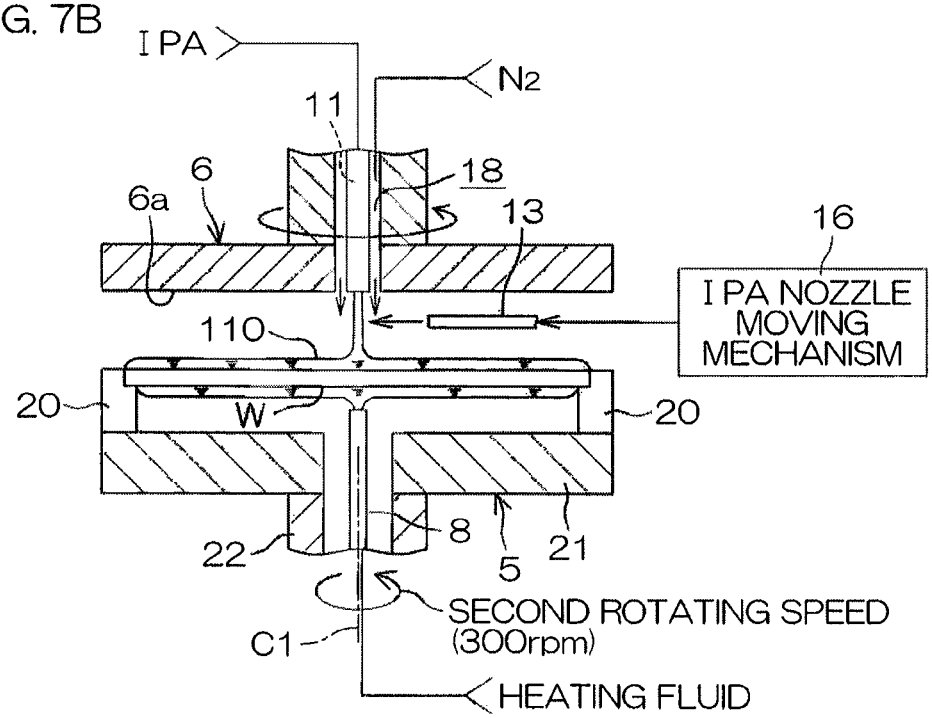

Referring to FIG. 6 and FIG. 7B, in the organic solvent processing (S4), the liquid film forming step T2 is carried out after completion of the organic solvent rinsing step T1. In the liquid film forming step T2, a liquid film 110 of the IPA is formed on the upper surface of the substrate W.

By continuing to supply IPA from the central IPA nozzle 11 to the upper surface of the substrate W, DIW on the substrate W is replaced by IPA and the IPA liquid film 110 is formed on the upper surface of the substrate W (liquid film forming step). The controller 3 drives the electric motor 23 to decelerate rotation of the spin base 21 to a second rotational speed. The second rotational speed is lower than the first rotational speed. After the DIW on the substrate W has been replaced with IPA and while the liquid film forming step (rotation decelerating step) is continuing, rotation of the substrate W is thereby decelerated to the second rotational speed. The second rotational speed is 300 rpm, for example. The second rotational speed is a speed at which the liquid film 110 can be held on the upper surface of the substrate W after the liquid film 110 has been formed. The second rotational speed is not limited to 300 rpm. The second rotational speed may be any speed between 300 rpm to 500 rpm, for example, or the second rotational speed may be a lower speed than 300 rpm (for example, 50 rpm or lower).

After completion of the rotation decelerating step, the controller 3 opens the heating fluid valve 51 to supply the heating fluid from the lower surface nozzle 8 to the lower surface of the substrate W. Heating of the substrate W is thereby initiated (substrate heating step).

The controller 3 controls the shielding member rotating mechanism 33 to keep the rotational speed of the shielding member at 1000 rpm, for example. The controller 3 controls the shielding member raising/lowering mechanism 32 to move (raise) the shielding member 6 from the first proximal position to a second proximal position, for example. In a case where the space A has been formed, the interval between the upper surface of the substrate W and the facing surface 6a of the shielding member 6 may be adjusted while maintaining the space A (interval adjusting step). When the shielding member 6 is positioned at the second proximal position, the facing surface 6a of the shielding member 6 is proximal to the upper surface of the substrate W. The second proximal position is a position higher than the first proximal position. The position of the facing surface 6a is higher when the shielding member 6 is positioned at the second proximal position than when the shielding member 6 is positioned at the first proximal position. When the shielding member 6 is positioned at the second proximal position, the distance between the facing surface 6a and the upper surface of the substrate W is approximately 15 mm. The IPA nozzle 13 can move in the horizontal direction between the facing surface 6a of the shielding member 6 and the upper surface of the substrate W, when the shielding member 6 is positioned at least at the second proximal position or at a position higher than the second proximal position.

In the interval adjustment step, the controller 3 controls the first guard raising/lowering mechanism 46 to move the first guard 43 together with the shielding member 6, with respect to the substrate W. The first guard 43 is therefore disposed at the shielding member facing position even after the interval adjusting step. As a result, the state where the space A is formed is maintained before and after the interval adjusting step. If the second guard 44 is positioned higher than the substrate facing position at the start of the liquid film forming step, then the controller 3 may control the second guard raising/lowering mechanism 47 to move the second guard 44 to the substrate facing position.

While the liquid film 110 of the IPA is formed on the substrate W, the controller 3 controls the IPA nozzle moving mechanism 16 to move the IPA nozzle 13 disposed at the retreat position toward the processing position. When the IPA nozzle 13 is positioned at the processing position, the discharge port 13a of the IPA nozzle 13 is shifted slightly (about 40 mm, for example) from the center region of the substrate W toward the peripheral edge side of the substrate W.

In the liquid film forming step T2, supply of inert gas from the inert gas flow channel 18, that was initiated in the DIW rinse processing (S3), is maintained. The flow rate of inert gas in the liquid film forming step T2 is 50 liter/min, for example.

Figure 7C:
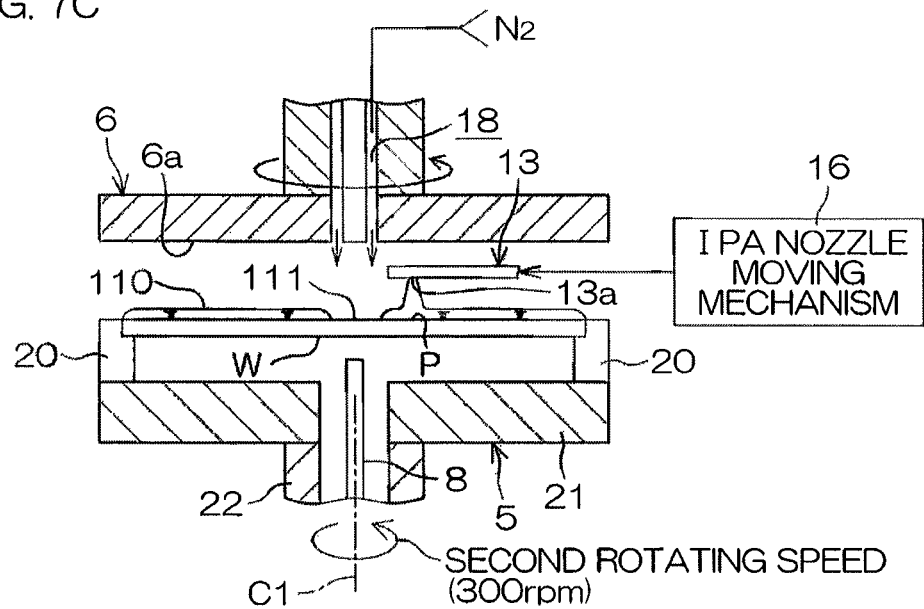

Referring to FIG. 6 and FIG. 7C, in the organic solvent processing (S4), the opening forming step T3 is carried out after completion of the liquid film forming step T2. In the opening forming step T3, an opening 111 is formed in the center region of the liquid film 110 of the IPA on the upper surface of the substrate W. The center region of the liquid film 110 is the region around the center of the liquid film 110. The center region of the liquid film 110 includes the position of the liquid film 110 that crosses with the rotational axis line C1.

In the opening forming step T3, first, the controller 3 controls the electric motor 23 to keep rotation of the spin base 21 at the second rotational speed.

Then, the controller 3 closes the central IPA valve 58 to interrupt supply of the IPA to the upper surface of the substrate W by the central IPA nozzle 11. The controller 3 then opens the IPA valve 62 to initiate supply of the IPA from the IPA nozzle 13 toward the substrate W. A position in the upper surface of the substrate W where the IPA is supplied from the IPA nozzle 13 is referred to as a liquid landing point P. The landing point P is the position in the upper surface of the substrate W where the IPA supplied from the IPA nozzle 13 lands. The controller 3 then controls the IPA nozzle moving mechanism 16 to move the IPA nozzle 13 disposed at the processing position toward the outer peripheral position. When the IPA nozzle 13 is positioned at the outer peripheral position, the discharge port 13a of the IPA nozzle 13 faces the peripheral edge of the substrate W (a position shifted by 140 mm, for example, from the center region of the substrate W toward the peripheral edge side of the substrate W).

Then, the controller 3 controls the second inert gas valve 68 to blow the inert gas (for example, a N2 gas) perpendicularly from the inert gas flow channel 18 toward the center region of the upper surface of the substrate W (inert gas blowing step). The flow rate of the inert gas at this time is 100 liter/min, for example. A small opening 111 (for example, about 30 mm in diameter) is thereby formed in the center region of the liquid film 110 on the substrate W that is rotating at the second rotational speed, and the center region of the upper surface of the substrate W is exposed (opening forming step). The inert gas blowing step may be initiated simultaneously with supply of the IPA from the IPA nozzle 13 that is disposed at the processing position. The inert gas blowing step may alternatively be initiated immediately after initiating supply of the IPA from the IPA nozzle 13 that is disposed at the processing position.

While the opening forming step is being carried out, the controller 3 closes the heating fluid valve 51 to interrupt supply of the heating fluid from the lower surface nozzle 8. Heating of the substrate W is thereby interrupted while the opening forming step is being carried out (heating interrupting step).

The controller 3 controls the shielding member rotating mechanism 33 to keep the rotational speed of the shielding member at 1000 rpm, for example. The controller 3 may control the guard raising/lowering mechanisms 46 to 48 to move the guards 43 to 45 such that the state where the space A is formed is maintained. When the second guard 44 is positioned higher than the substrate facing position at the start of the opening forming step, the controller 3 may move the second guard 44 to the substrate facing position.

Figure 7D:
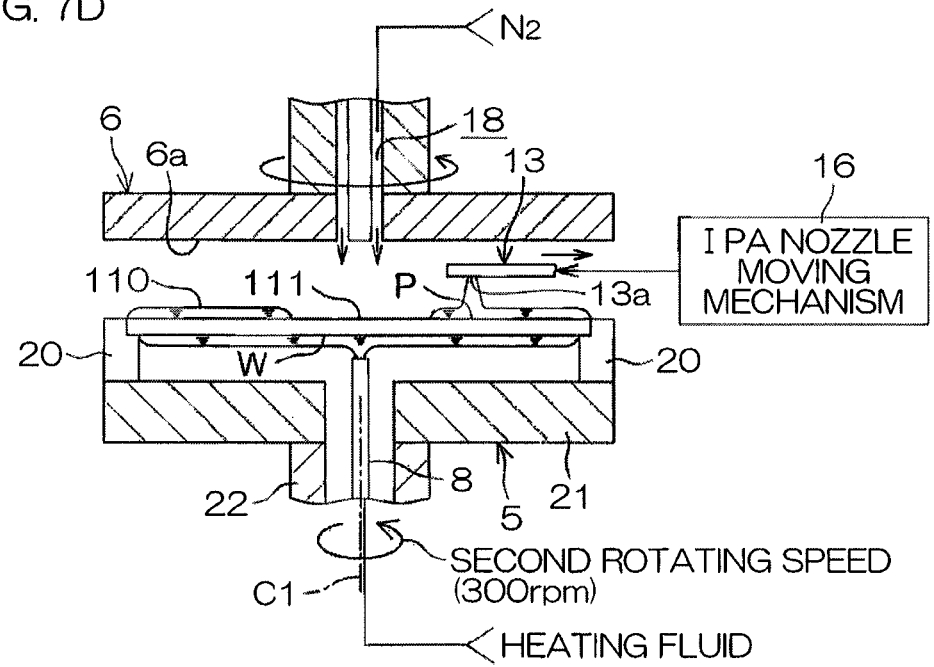

Referring to FIG. 6 and FIG. 7D, in the organic solvent processing (S4), the liquid film removing step T4 is carried out after completion of the opening forming step T3. In the liquid film removing step T4, the liquid film 110 of the IPA on the upper surface of the substrate W is removed.

In the liquid film removing step T4, after completion of the opening forming step, the controller 3 opens the heating fluid valve 51 to supply the heating fluid from the lower surface nozzle 8 to the lower surface of the substrate W. Heating of the substrate W is thereby resumed (heating resuming step).

The controller 3 controls the electric motor 23 to keep rotation of the spin base 21 at the second rotational speed. The opening 111 is widened by centrifugal force of the substrate W that is rotating at the second rotational speed, and the liquid film 110 of the IPA is gradually removed from the upper surface of the substrate W (liquid film removing step).

When the opening 111 is widened, the controller 3 maintains the open state of the IPA valve 62, and continues to supply the IPA from the IPA nozzle 13 to a position of the upper surface of the substrate W that is the outer side of the opening 111 (low surface tension liquid supply step). The outer side of the opening 111 is the opposite side to the rotational axis line C1 with respect to the peripheral edge of the opening 111 (further toward the radially outer side than the peripheral edge of the opening 111). The inner side of the opening 111 is the rotational axis line C1 side with respect to the peripheral edge of the opening 111 (further toward the radially inner side than the peripheral edge of the opening 111).

The controller 3 moves the liquid landing point P so as to follow widening of the opening 111 (liquid landing point moving step). Specifically, the controller 3 controls the IPA nozzle moving mechanism 16 to move the IPA nozzle 13 toward the peripheral edge of the substrate W, in order to make the liquid landing point P follow the widening of the opening 111. More specifically, the driving mechanism 81 (refer to FIG. 3) rotationally drives the support member 80 (refer to FIG. 3) around a prescribed central axis. The IPA nozzle 13 thereby moves along the upper surface of the substrate W toward the radially outer side (nozzle moving step). The IPA nozzle moving mechanism 16 is an example of a liquid landing point changing unit that changes the liquid landing point P.

Blowing of the inert gas by the inert gas flow channel 18 may be continued until the liquid film 110 is removed from the upper surface of the substrate W. Stated differently, blowing of the inert gas by the inert gas flow channel 18 may be continued until completion of the liquid film removing step. Action of the blowing force of the inert gas onto the liquid film 110 of the IPA promotes expansion of the opening 111. The flow rate of the inert gas may be increased in a stepwise manner. For example, in the present preferred embodiment, the inert gas flow rate is kept in a state increased to 200 liter/min for a prescribed time period after the opening 111 has been formed, and then kept in a state increased to 300 liter/min for a prescribed time period thereafter.

At this time, the controller 3 may control the first inert gas valve 60 to supply the inert gas also from the inert gas nozzle 12 to the center region of the upper surface of the substrate W. Thereby, widening of the opening 111 is further promoted.

In the liquid film removing step T4, the controller 3 controls the shielding member rotating mechanism 33 to keep the rotational speed of the shielding member at 1000 rpm, for example. The controller 3 may control the shielding member raising/lowering mechanism 32 to maintain a state with the shielding member 6 positioned at the second proximal position. The controller 3 may control the guard raising/lowering mechanisms 46 to 48 to move the guards 43 to 45 so that the state where the space A is formed is maintained. In a case where the second guard 44 is positioned higher than the substrate facing position at the start of the liquid film removing step T4, the controller 3 may move the second guard 44 to the substrate facing position.

In the opening forming step T3 and liquid film removing step T4, the substrate W is rotated at a second rotational speed that is a lower speed than the first rotational speed. Adhesion of the heating fluid to the upper surface of the substrate W caused by splashing of the heating fluid that has been supplied to the lower surface of the substrate W is thus minimized. Adhesion of the IPA droplets on the inner side of the opening 111 and on the facing surface 6a of the shielding member 6, which is caused by splashing of the IPA that has been supplied to a position of the upper surface of the substrate W on the outer side of the opening 111, is also minimized.

The liquid film removing step T4 is ended, for example, when the IPA nozzle 13 reaches the outer peripheral position. Alternatively, the organic solvent processing (S4) may be ended when the peripheral edge of the opening 111 reaches the peripheral edge of the substrate W.

Next, the drying processing (S5: spin drying) will be described with reference to FIG. 6. After the organic solvent processing (S4) is ended, the drying processing (S5) is carried out. In the drying processing (S5), the liquid component on the upper surface of the substrate W is spun off by centrifugal force.

Specifically, the controller 3 closes the heating fluid valve 51 to interrupt supply of the heating fluid to the lower surface of the substrate W. The controller 3 controls the IPA nozzle moving mechanism 16 to retreat the IPA nozzle 13 to the retreat position. The controller 3 then controls the IPA valve 62 to interrupt supply of the IPA from the IPA nozzle 13. The controller 3 then closes the first inert gas valve 60 to interrupt supply of the inert gas from the inert gas nozzle 12.

Then, the controller 3 controls the shielding member raising/lowering mechanism 32 to move the shielding member 6 to the lower position. Then, the controller 3 controls the second guard raising/lowering mechanisms 47 and the third guard raising/lowering mechanisms 48 to dispose the second guard 44 and the third guard 45 lower than the substrate facing position. Then, the controller 3 controls the first guard raising/lowering mechanisms 46 to lower the first guard 43 to dispose the first guard 43 at a position slightly higher than the lower position and slightly higher than the substrate facing position.

Then, the controller 3 controls the electric motor 23 to accelerate the rotation of the spin base 21 in a stepwise manner. Specifically, the rotation of the spin base 21 is maintained at 500 rpm, for example, for a prescribed time period, then accelerated to 750 rpm and maintained for a prescribed time period, and then accelerated to 1500 rpm and maintained for a prescribed time period. Thereby, the liquid component on the substrate W is spun off by centrifugal force.

Then, the controller 3 controls the shielding member rotating mechanism 33 to rotate the shielding member 6 at 1000 rpm, for example. The controller 3 controls the shielding member rotating mechanism 33 to accelerate the rotation of the shielding member 6 to 1500 rpm at a timing when the rotational speed of the substrate W becomes 1500 rpm, so that the spin base 21 and the shielding member 6 are rotated in synchronization.

In the drying processing (S5), supply of the inert gas from the inert gas flow channel 18 is maintained. The flow rate of the inert gas is, for example, the same as the flow rate when the liquid film removing step T4 is ended (300 liter/min). When the rotation of the substrate W is accelerated to 1500 rpm, the controller 3 controls the second inert gas valve 68 to reduce the flow rate of the inert gas to 200 liter/min.

Thereafter, the controller 3 closes the second inert gas valve 68 to interrupt supply of the inert gas from the inert gas flow channel 18. The controller 3 controls the electric motor 23 to interrupt the rotation of the spin chuck 5. The controller 3 then controls the shielding member rotating mechanism 33 to stop rotation of the shielding member 6. The controller 3 then controls the shielding member raising/lowering mechanism 32 to retreat the shielding member 6 to the higher position. Then, the controller 3 controls the guard raising/lowering mechanisms 46 to 48 to move the guards 43 to 45 to the lower position.

Thereafter, the transfer robot CR enters the processing unit 2, scoops up the already-processed substrate W from the spin chuck 5, and carries the substrate W out of the processing unit 2 (S6). The substrate W is delivered from the transfer robot CR to the transfer robot IR, and housed in the carrier C by the transfer robot IR.

According to the first preferred embodiment, in the liquid film forming step, the IPA is supplied to the substrate W that is rotating at the first rotational speed which is a relatively high speed. After the DIW on the substrate W has been replaced with the IPA, and while continuing the liquid film forming step, rotation of the substrate W is decelerated to the second rotational speed that is a lower speed than the first rotational speed. Consequently, the centrifugal force acting on the DIW on the substrate W is great in comparison to a substrate processing in which rotation of the substrate W is accelerated in a stepwise manner during replacement of DIW on the substrate W with the IPA. The time until replacement of DIW on the substrate W with the IPA is therefore shortened. Stated differently, the time until formation of the IPA liquid film 110 is shortened.

Incidentally, the centrifugal force acting on the IPA on the substrate W that is rotating at the first rotational speed is as great as the centrifugal force acting on the DIW on the substrate W. However, when the DIW on the substrate W is replaced with the IPA, the IPA continues to be supplied onto the upper surface of the substrate W. Disruption of the liquid film 110 during formation can therefore be minimized.

In addition, the time until replacement of the DIW on the substrate W with the IPA can be shortened for the same reason, even in comparison to a substrate processing in which the substrate W is rotated at the second rotational speed that is a lower speed than the first rotational speed, without changing the rotational speed of the substrate W, during the liquid film forming step.

Furthermore, after completion of the liquid film forming step, the opening 111 is formed in the center region of the liquid film 110 in a state where the rotational speed of the substrate W is kept at the second rotational speed. The centrifugal force acting on the liquid film 110 is therefore lowered in comparison to substrate processing in which rotation of the substrate W is accelerated in the opening forming step or liquid film removing step. Consequently, disruption of the liquid film 110 is minimized and the liquid film 110 is satisfactorily removed from the upper surface of the substrate W.

Thus, the time required for formation of the IPA liquid film 110 can be shortened and the liquid film 110 can be satisfactorily removed.

Furthermore, the first rotational speed is a speed at which the processing liquid such as DIW can be rapidly spun off outward from the substrate. The DIW on the substrate W can therefore be rapidly replaced by the IPA.

Furthermore, the second rotational speed is a speed at which the liquid film 110 is held on the substrate W. Disruption of the liquid film 110 can therefore be minimized.

The substrate W is rotated at the first processing liquid speed while the DIW is supplied to the upper surface of the substrate W, and thereafter rotation of the substrate W is accelerated to the second processing liquid speed which is a higher speed than the first processing liquid speed. Processing of the upper surface of the substrate W by the DIW is therefore carried out rapidly.

Also, since the second processing liquid speed is the same speed as the first rotational speed, the DIW on the substrate W is replaced with the IPA while keeping the rotational speed of the substrate at a high speed. Therefore, the time required to change the rotational speed of the substrate is reduced. Consequently, the DIW on the substrate W can be rapidly replaced by the IPA.

Furthermore, the substrate W is heated in a state where the liquid film 110 is held on the upper surface, and vaporization of the IPA in the liquid film 110 is thereby accelerated. On the other hand, while the opening forming step is being carried out, heating of the substrate W is interrupted. Consequently, the opening 111 is satisfactorily formed in the center region of the liquid film 110 and the IPA is moderately vaporized. Specifically, partial drying of the center region of the liquid film 110 due to accelerated vaporization of the IPA is minimized, when the opening 111 is formed in the liquid film 110. Thus, residue of the IPA droplets on the inner side of the opening 111 is minimized. The liquid film 110 on the substrate W is therefore rapidly removed by centrifugal force of rotation of the substrate W, and vaporization of the IPA by heating of the substrate W. The liquid film 110 on the upper surface of the substrate W is satisfactorily removed as a result.

Moreover, since heating of the substrate W is resumed after completion of the opening forming step, vaporization of the IPA in the liquid film 110 is accelerated even further after completion of the opening forming step. The liquid film 110 on the upper surface of the substrate W is even more satisfactorily removed as a result.

Furthermore, the substrate heating step is initiated after completion of the rotation decelerating step. That is, heating of the substrate W is interrupted while the substrate W is being rotated at a relatively high speed. Consequently, the liquid film 110 is rapidly formed, and exposure of the upper surface of the substrate W due to disappearance of the IPA from the substrate W before the opening forming step is minimized.

The opening forming step also includes an inert gas blowing step of blowing an inert gas toward the center region of the liquid film 110. Therefore, by blowing an inert gas, the opening 111 is instantaneously formed in the center region of the liquid film 110 without leaving droplets in the center region of the substrate W.

Also, the IPA is supplied to a position of the substrate W further outward than the opening 111. Consequently, disruption of the liquid film 110 caused by local vaporization of the IPA on the outer side of the opening 111 is minimized.

Furthermore, by moving the position where the IPA is supplied on the substrate W to follow widening of the opening 111, the IPA continues to be supplied to a position further outward than the opening 111, regardless of the size of the opening 111. Consequently, disruption of the liquid film 110 caused by local vaporization of the IPA on the outer side of the opening 111 is further minimized.

Second Preferred Embodiment

Figure 8:
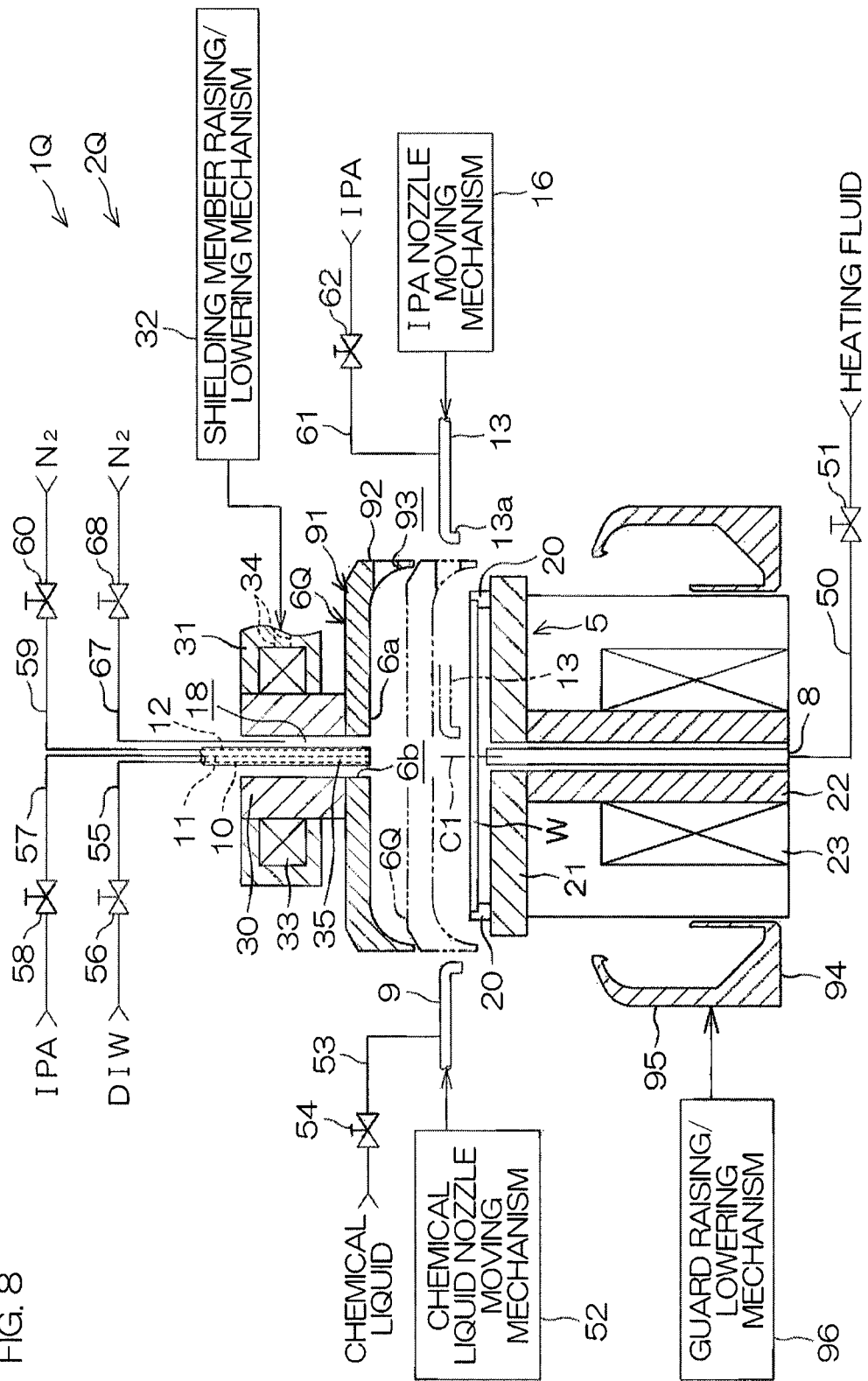
FIG. 8 is an illustrative cross-sectional view for explaining a configuration example of a processing unit in a substrate processing apparatus according to a second preferred embodiment of the present invention.

Next, a second preferred embodiment of the present invention will be described. FIG. 8 is an illustrative cross-sectional view for explaining a configuration example of a processing unit 2Q in a substrate processing apparatus 1Q according to the second preferred embodiment. In the second preferred embodiment shown in FIG. 8, the same members as those explained above are indicated by like reference numerals, and their explanation will be omitted.

The main difference between the processing unit 2Q of the second preferred embodiment shown in FIG. 8 and the processing unit 2 of the first preferred embodiment (refer to FIG. 3) is that a shielding member 6Q of the processing unit 2Q includes a facing member 91 and an annular portion 92. The facing member 91 faces the upper surface of the substrate W. The annular portion 92 extends downward from the peripheral edge portion of the facing member 91 so as to surround the substrate W in plan view.

The facing member 91 is formed to a disk shape. The facing member 91 is disposed substantially horizontally above the spin chuck 5. The facing member 91 has a facing surface 6a that faces the upper surface of the substrate W. A hollow shaft 30 is fixed on the side of the facing member 91 opposite the facing surface 6a.

The shielding member 6Q can be raised and lowered between a higher position and a lower position by the shielding member raising/lowering mechanism 32, similar to the shielding member 6 of the first preferred embodiment, and The shielding member 6Q can be positioned at the first proximal position and the second proximal position between the higher position and the lower position. When the shielding member 6Q is positioned at the lower position, the first proximal position, or the second proximal position, the annular portion 92 faces the substrate W from the horizontal direction. When the annular portion 92 faces the substrate W from the horizontal direction, the atmosphere between the facing surface 6a of the shielding member 6Q and the upper surface of the substrate W is shielded from the ambient atmosphere.

In the shielding member 6Q, a penetrating hole 93 penetrating the annular portion 92 in the rotational radius direction of the substrate W, is formed. The penetrating hole 93 penetrates the inner peripheral surface and the outer peripheral surface of the annular portion 92. The inner peripheral surface of the annular portion 92 of the shielding member 6Q is curved so as to be lowered as the inner peripheral surface of the annular portion 92 goes toward the radially outer side. The outer peripheral surface of the annular portion 92 extends along the vertical direction. The penetrating hole 93 has the form of a long hole that is long in the vertical direction as viewed from the radially outer side, for example.

Also, the processing unit 2Q does not include the cups 41, 42, guards 43 to 45, and the guard raising/lowering mechanisms 46 to 48 of the first preferred embodiment. The processing unit 2Q instead includes a cup 94, a guard 95 and a guard raising/lowering mechanism 96. The cup 94 surrounds the spin chuck 5. The guard 95 is formed integrally with the cup 94. The guard 95 receives the processing liquid that has been removed out of the substrate W, from the substrate W that is held by the spin chuck 5. The guard raising/lowering mechanism 96 drives raising and lowering of the guard 95.

Unlike the first preferred embodiment, the IPA nozzle 13 of the second preferred embodiment extends in a linear manner in the horizontal direction. Unlike the first preferred embodiment, the discharge port 13a of the IPA nozzle 13 of the second preferred embodiment extends downward from the tip of the IPA nozzle 13. Also, the IPA nozzle moving mechanism 16 of the second preferred embodiment is disposed further to the radially outer side than the annular portion 92 of the shielding member 6Q. The IPA nozzle moving mechanism 16 of the second preferred embodiment can move the IPA nozzle 13 in a linear manner in the direction in which the IPA nozzle 13 extends.

The IPA nozzle 13 can be inserted through the penetrating hole 93. In a state where the penetrating hole 93 is positioned higher than the substrate W (for example, in a state where the shielding member 6Q is positioned at the second proximal position), the IPA nozzle 13 can move between the position further toward the rotational axis line C1 side than the annular portion 92 (further toward the radially inner side than the annular portion 92), and a position on the opposite side of the rotational axis line C1 with respect to the annular portion 92 (further toward the radially outer side than the annular portion 92), via the penetrating hole 93. That is, the penetrating hole 93 is provided in the annular portion 92, and functions as a passage-allowing portion to allow passage of the IPA nozzle 13 through the annular portion 92. In FIG. 8, the IPA nozzle 13 that is disposed at a position further toward the radially inner side than the annular portion 92 is indicated by a two short dashed line.

In the substrate processing apparatus 1Q of the second preferred embodiment, substantially the same substrate processing can be carried out as with the substrate processing apparatus 1 of the first preferred embodiment, except for the steps related to raising and lowering of the guards 43 to 45 (refer to FIG. 3), and therefore it will not be explained again. In substrate processing with the substrate processing apparatus 1Q, however, it is necessary to stop rotation of the shielding member 6Q when the IPA nozzle 13 is passed through the penetrating hole 93 in the liquid film forming step T2, the opening forming step T3, and the liquid film removing step T4. Moreover, in substrate processing with the substrate processing apparatus 1Q, the guard raising/lowering mechanism 96 may be controlled to raise and lower the guard 95 such that the guard 95 does not interfere with the IPA nozzle 13.

According to the second preferred embodiment, the same effect as those of the first preferred embodiment are exhibited.

Third Preferred Embodiment

Figure 9:
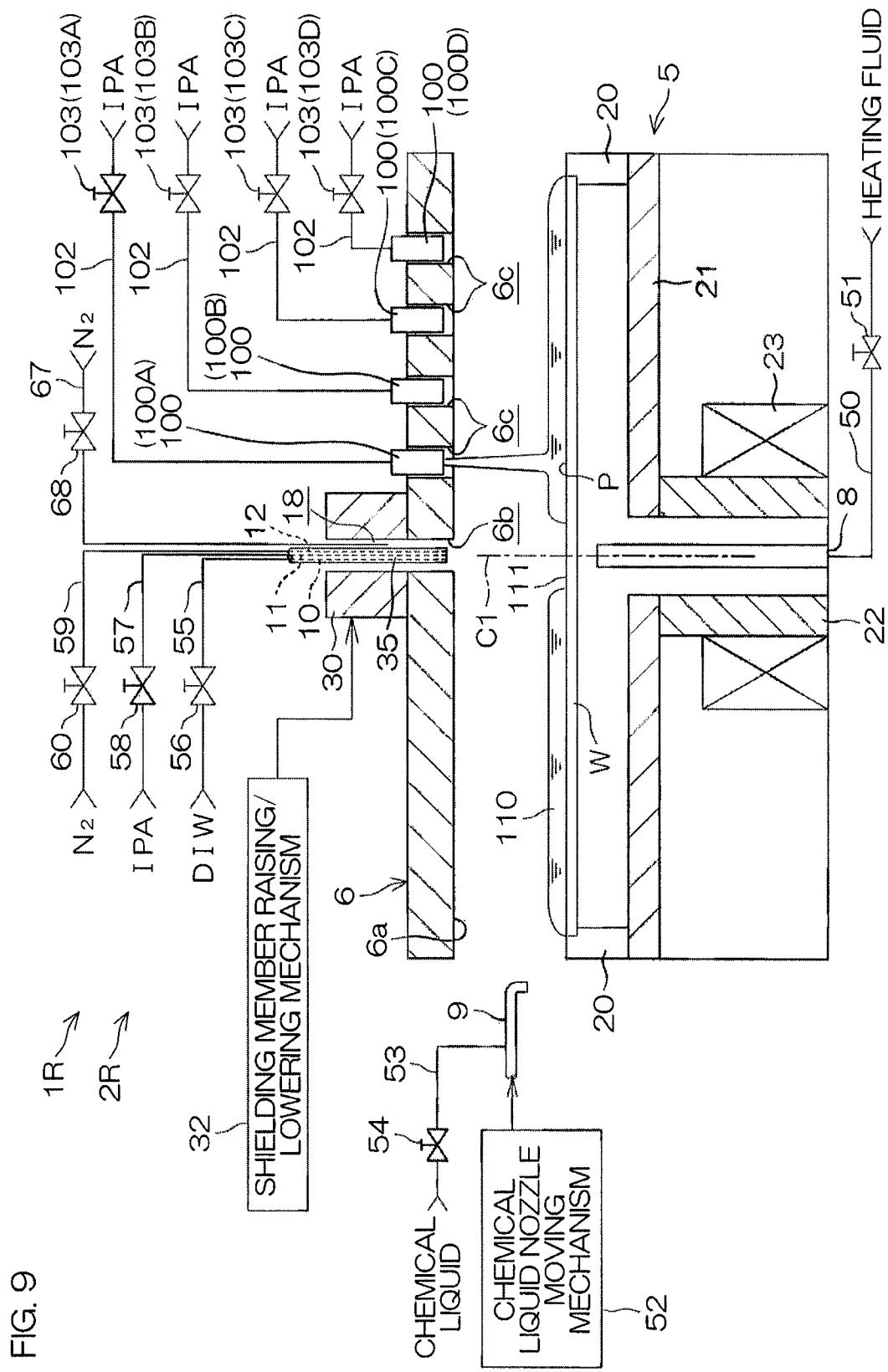
FIG. 9 is an illustrative cross-sectional view for explaining a configuration example of a processing unit in a substrate processing apparatus according to a third preferred embodiment of the present invention.

Next, a third preferred embodiment of the present invention will be described. FIG. 9 is an illustrative cross-sectional view for explaining a configuration example of a processing unit 2R in a substrate processing apparatus 1R according to the third preferred embodiment of the present invention. In the third preferred embodiment shown in FIG. 9, the same members as those explained above are indicated by like reference numerals, and their explanation will be omitted.

The main difference between the processing unit 2R of the third preferred embodiment shown in FIG. 9 and the processing unit 2 of the first preferred embodiment (refer to FIG. 3) is that the processing unit 2R includes a plurality of spaced IPA nozzles 100, instead of the IPA nozzle 13.

The plurality of spaced IPA nozzles 100 are respectively disposed at a plurality of positions at different distances from the rotational axis line C1. The plurality of spaced IPA nozzles 100 supply the IPA toward a position distant from the rotation center position of the upper surface of the substrate W. The plurality of spaced IPA nozzles 100 are an example of low surface tension liquid supply units that supply a low surface tension liquid such as IPA to the upper surface of the substrate W. In this preferred embodiment, the plurality of spaced IPA nozzles 100 are disposed side by side along the rotational radius direction of the substrate W. The tips (discharge ports) of each of the plurality of spaced IPA nozzles 100 are housed respectively in a plurality of supply ports 6c formed in the facing surface 6a of the shielding member 6. The IPA discharged from the plurality of spaced IPA nozzles 100 is supplied to the upper surface of the substrate W through the supply ports 6c. In this preferred embodiment, the plurality of supply ports 6c are penetrating holes running through the shielding member 6 in the vertical direction Z.

A plurality of spaced IPA supply pipes 102 are respectively coupled with the plurality of spaced IPA nozzles 100, and a plurality of spaced IPA valves 103 are respectively interposed in the plurality of spaced IPA supply pipes 102. Stated differently, an individual spaced IPA supply pipe 102 is coupled with each spaced IPA nozzle 100, and one spaced IPA valve 103 is interposed in each spaced IPA supply pipe 102.

Each of the plurality of spaced IPA valves 103 constitutes a supply switching unit that switches the IPA supply to the corresponding spaced IPA nozzle 100 on or off. At least two spaced IPA nozzles 100 are provided, and the IPA can be supplied from at least two spaced IPA nozzles 100. The controller 3 can control the plurality of spaced IPA valves 103 to change the liquid landing point P to at least two positions other than the rotation center position of the upper surface of the substrate W. In other words, the plurality of spaced IPA valves 103 are an example of the liquid landing point changing unit.

With the substrate processing apparatus 1R of the third preferred embodiment, substantially the same substrate processing can be carried out as with the substrate processing apparatus 1 of the first preferred embodiment, except for the steps related to raising and lowering of the guards 43 to 45 (refer to FIG. 3) and rotation of the shielding member 6. However, the liquid film removing step T4 of the organic solvent processing (S4) differs.

The main difference between the organic solvent processing (S4) with the substrate processing apparatus 1R of the third preferred embodiment and the organic solvent processing (S4) with the substrate processing apparatus 1 of the first preferred embodiment is that in the liquid film removing step T4 with the substrate processing apparatus 1R, the plurality of spaced IPA nozzles 100 are used instead of the IPA nozzle 13.

In the liquid film removing step T4 with the substrate processing apparatus 1R, the controller 3 sets the liquid landing point P on the outer side of the opening 111 while the opening 111 is widened. The controller 3 then opens the spaced IPA valves 103 and initiates supply of a low surface tension liquid such as the IPA from the corresponding spaced IPA nozzles 100 to the liquid landing points P (low surface tension liquid supply step). The controller 3 moves the liquid landing point P so as to follow widening of the opening 111 (liquid landing point moving step).

Here, in FIG. 9, the reference numerals 100A to 100D are used for denotation in order from the spaced IPA nozzle 100 nearest the rotation center position of the substrate W. The reference numerals 103A to 103D are used for denotation of the respective spaced IPA valves 103 corresponding to the spaced IPA nozzles 100A to 100D.

An example of the liquid landing point moving step according to the third preferred embodiment will now be described in detail, when a state in which the spaced IPA nozzle 100A is supplying the IPA to the liquid landing point P immediately after the opening 111 has been formed (the state illustrated in FIG. 9), is assumed.

The controller 3 moves the liquid landing point P to the radially outer side before the peripheral edge of the opening 111 reaches the liquid landing point P, in order to cause the liquid landing point P to follow widening of the opening 111. Specifically, before the peripheral edge of the opening 111 reaches the position where the IPA supplied from the spaced IPA nozzle 100A lands, the controller 3 closes the spaced IPA valve 103A and opens the spaced IPA valve 103B. The spaced IPA nozzles 100 that supply the IPA to the upper surface of the substrate W are thereby switched from the spaced IPA nozzle 100A to the spaced IPA nozzle 100B. Then, before the peripheral edge of the opening 111 reaches the position where IPA supplied from the spaced IPA nozzle 100B lands, the controller 3 controls the spaced IPA valves 103. The spaced IPA nozzles 100 that supply the IPA to the upper surface of the substrate W are thereby switched to a different spaced IPA nozzle 100 (spaced IPA nozzle 100C or spaced IPA nozzle 100D) positioned on the radially outer side.

Thus, in the liquid film removing step T4 of the third preferred embodiment, the spaced IPA nozzles 100 that supply the IPA are switched to match widening of the opening 111, thereby the liquid landing point P can be moved.

According to the third preferred embodiment, the same effect as those of the first preferred embodiment are exhibited.

Moreover, according to the third preferred embodiment, it is not necessary to move the nozzles between the shielding member 6 and the substrate W in the organic solvent processing (S4). Consequently, the substrate W can thereby be processed with a state where the shielding member 6 is close to the substrate W in comparison to the first preferred embodiment.

Unlike the third preferred embodiment, a single spaced IPA nozzle 100 may be provided in the processing unit 2R instead of the plurality of spaced IPA nozzles 100.

The present invention is not restricted to the preferred embodiments described above and may be implemented in yet other modes.

For example, heating of the substrate W in the respective preferred embodiments described above was carried out only by supplying a heating fluid from the lower surface nozzle 8. However, the substrate W may be heated using means other than the lower surface nozzle 8. For example, a heater or the like built into either or both the spin base 21 and the shielding member 6 may be used for heating of the substrate W.

Also, in the respective preferred embodiments described above, heating of the substrate W was not initiated in the organic solvent rinsing step T1, but the substrate W may be heated in the organic solvent rinsing step T1, unlike the first preferred embodiment.

Also, the IPA nozzle 13 and the plurality of spaced IPA nozzles 100 were configured such that the IPA was supplied onto the upper surface of the substrate W. However, unlike the first preferred embodiment to the third preferred embodiment, the IPA nozzle 13 or the spaced IPA nozzles 100 may be configured so as to supply a liquid other than the IPA. The liquid other than the IPA may be a rinse liquid or chemical liquid, for example.

Furthermore, the discharge port 13a of the IPA nozzle 13 of the first preferred embodiment and the second preferred embodiment were configured such that the IPA was discharged in the vertical direction (downward) onto the upper surface of the substrate W. However, the discharge port 13a of the IPA nozzle 13 may be able to discharge the IPA toward the upper surface of the substrate W in a direction inclined with respect to the vertical direction and the horizontal direction, unlike the first preferred embodiment and the second preferred embodiment. The direction in which the IPA is discharged from the discharge port 13a may be, for example, a direction inclined with respect to the vertical direction and the horizontal direction such that the direction is oriented toward the peripheral edge side of the substrate W as the direction in which the IPA is discharged from the discharge port 13a approaches the upper surface of the substrate W.

In addition to the features described in the claims, the following features can be extracted from the specification and the attached drawings. These features can be arbitrarily combined with the features described under SUMMARY OF THE INVENTION.

A1. A substrate processing method comprising:

a substrate holding step of holding a substrate horizontally;

a processing liquid supply step of supplying a processing liquid which contains a water to the horizontally held substrate;

a substrate rotating step of rotating the horizontally held substrate;

a liquid film forming step of supplying a low surface tension liquid having a lower surface tension than water onto an upper surface of the substrate, in order to replace the processing liquid on the substrate with the low surface tension liquid and to form a liquid film of the low surface tension liquid on the upper surface of the substrate;

a substrate heating step of heating the substrate which is horizontally held;

an opening forming step of forming an opening in a center region of the liquid film on the substrate after completion of the liquid film forming step; and a liquid film removing step of widening the opening to remove the liquid film from the upper surface of the substrate;

wherein the substrate heating step includes a heating interrupting step of interrupting heating of the substrate which is horizontally held, when the opening is formed.

For satisfactory formation of an opening in the liquid film of the low surface tension liquid, it is necessary to prevent residue of droplets of the low surface tension liquid on the inner side of the opening. According to the substrate processing method described in A1, heating of the substrate is interrupted when the opening is formed in the center region of the liquid film of the low surface tension liquid on the substrate. Therefore, since vaporization of the low surface tension liquid due to heating of the substrate is minimized when the opening is formed, local vaporization of the low surface tension liquid in a portion of the center region of the liquid film due to heating of the substrate is also minimized. Consequently, residue of droplets of the low surface tension liquid on the inner side of the opening is minimized and an opening is thereby satisfactorily formed. As a result, the liquid film is satisfactorily removed.

A2. The substrate processing method according to A1, wherein the substrate heating step includes a step of resuming heating of the substrate which is horizontally held, after completion of the opening forming step.

According to the substrate processing method described in A2, heating of the substrate is resumed after completion of the opening forming step, and therefore vaporization of the low surface tension liquid in the liquid film is accelerated after completion of the opening forming step. Consequently, an opening is satisfactorily formed and the liquid film is satisfactorily removed from the upper surface of the substrate.

A3. The substrate processing method according to A1 or A2, further including a rotation decelerating step of decelerating rotation of the substrate while continuing the liquid film forming step, after the processing liquid on the substrate which is horizontally held has been replaced with a low surface tension liquid having lower surface tension than water;

wherein the substrate heating step is initiated after completion of the rotation decelerating step.

According to the substrate processing method described in A3, in the rotation decelerating step, rotation of the substrate is decelerated while continuing the liquid film forming step, after the processing liquid on the substrate has been replaced with the low surface tension liquid. Consequently, the time required until the processing liquid on the substrate is replaced with the low surface tension liquid is shortened, since the centrifugal force acting on the processing liquid is great in comparison to a substrate processing in which rotation of the substrate is accelerated in a stepwise manner when the processing liquid on the substrate is replaced with the low surface tension liquid.

Furthermore, the substrate heating step is initiated after completion of the rotation decelerating step. That is, heating of the substrate is interrupted while the substrate is being rotated at a relatively high speed. Consequently, the liquid film is rapidly formed, and exposure of the upper surface of the substrate due to disappearance of the low surface tension liquid from the substrate before the opening forming step is minimized.

A4. The substrate processing method according to A3, wherein the rotation decelerating step includes a step of decelerating rotation of the substrate from a first rotational speed at which the processing liquid is spun off outward from the substrate which is horizontally held, to a second rotational speed which is a lower speed than the first rotational speed and at which the liquid film to be held after the liquid film has been formed.

According to the substrate processing method described in A4, the processing liquid on the substrate is satisfactorily replaced by the low surface tension liquid, and disruption of the liquid film is minimized.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The present application corresponds to Japanese Patent Application No. 2016-168283 filed on Aug. 30, 2016 at the Japan Patent Office, and the entire disclosure of this application is incorporated herein by reference.

What is claimed is:

1. A substrate processing method comprising:
a substrate holding step of holding a substrate horizontally;
a processing liquid supply step of supplying a processing liquid containing a water, onto the horizontally held substrate;
a substrate rotating step of rotating the horizontally held substrate;
a liquid film forming step of supplying a low surface tension liquid having lower surface tension than water onto an upper surface of the horizontally held substrate while rotating the substrate at a first rotational speed, in order to replace the processing liquid on the substrate with the low surface tension liquid and form a liquid film of the low surface tension liquid on the upper surface of the substrate;
a rotation decelerating step of decelerating rotation of the horizontally held substrate to a second rotational speed that is a lower speed than the first rotational speed while continuing the liquid film forming step, after the processing liquid on the substrate has been replaced with the low surface tension liquid having lower surface tension than water;
an opening forming step of forming an opening in a center region of the liquid film on the substrate that rotates at the second rotational speed after completion of the liquid film forming step; and
a liquid film removing step of removing the liquid film from the upper surface of the substrate by widening the opening,
wherein the first rotational speed is a speed at which the processing liquid is spun off outward from the horizontally held substrate.

2. The substrate processing method according to claim 1, wherein the second rotational speed is a speed at which the liquid film is held on the substrate.

3. The substrate processing method according to claim 1, wherein the substrate rotating step includes a step of rotating the substrate at a first processing liquid speed while supplying a processing liquid containing a water, to the upper surface of the horizontally held substrate; and the method further comprises a substrate accelerating step of accelerating rotation of the substrate that rotates at the first processing liquid speed to a second processing liquid speed that is a higher speed than the first processing liquid speed.

4. The substrate processing method according to claim 3, wherein the second processing liquid speed is the same speed as the first rotational speed.

5. The substrate processing method according to claim 1, further comprising a substrate heating step of heating a substrate in a state of holding the liquid film on the upper surface;
wherein the substrate heating step includes a heating interrupting step of interrupting heating of the horizontally held substrate while the opening forming step is being carried out.

6. The substrate processing method according to claim 5, wherein the substrate heating step includes a heating resuming step of resuming heating of the horizontally held substrate after completion of the opening forming step.

7. The substrate processing method according to claim 5, wherein the substrate heating step is initiated after completion of the rotation decelerating step.

8. The substrate processing method according to claim 1, wherein the opening forming step includes an inert gas blowing step of blowing an inert gas toward the center region of the liquid film.

9. The substrate processing method according to claim 1, further comprising a low surface tension liquid supply step of supplying a low surface tension liquid having a lower surface tension than water onto the upper surface of the horizontally held substrate at a position further outward than the opening.

10. The substrate processing method according to claim 9, further comprising a step of moving the position on the upper surface of the horizontally held substrate, to which the low surface tension liquid having a lower surface tension than water is supplied, so as to follow widening of the opening.

* * * * *